(12) United States Patent
Okada et al.

(10) Patent No.: US 6,628,689 B2
(45) Date of Patent: Sep. 30, 2003

(54) SEMICONDUCTOR LASER DEVICE AND METHOD OF FABRICATING THE SAME

(75) Inventors: Makoto Okada, Ichikawa (JP); Koichi Gen-Ei, Ichikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 77 days.

(21) Appl. No.: 09/808,267

(22) Filed: Mar. 14, 2001

(65) Prior Publication Data

US 2001/0022796 A1 Sep. 20, 2001

(30) Foreign Application Priority Data

Mar. 14, 2000 (JP) ........................ 2000-069820

(51) Int. Cl.[7] .................................................. H01S 5/00
(52) U.S. Cl. ............................................ 372/49; 372/50
(58) Field of Search ............................ 372/29.013, 43, 372/49, 50; 438/221

(56) References Cited

U.S. PATENT DOCUMENTS

| | | | | | |
|---|---|---|---|---|---|
| 4,092,659 | A | * | 5/1978 | Ettenberg ...................... | 372/49 |
| 4,656,638 | A | * | 4/1987 | Tihanyi et al. ................. | 372/49 |
| 4,730,327 | A | * | 3/1988 | Gordon .......................... | 372/50 |
| 4,731,792 | A | * | 3/1988 | Shimizu et al. ................. | 372/49 |
| 4,794,609 | A | * | 12/1988 | Hara et al. ..................... | 372/50 |
| 4,852,112 | A | * | 7/1989 | Kagawa et al. ................. | 372/49 |
| 4,925,811 | A | * | 5/1990 | Menigaux et al. .............. | 438/33 |
| 4,951,291 | A | * | 8/1990 | Miyauchi et al. ............... | 372/49 |
| 4,955,030 | A | * | 9/1990 | Menigaux et al. .............. | 372/44 |
| 5,721,752 | A | * | 2/1998 | Takagi ............................ | 372/49 |
| 5,960,021 | A | * | 9/1999 | De Vrieze et al. ............. | 372/49 |
| 6,067,310 | A | * | 5/2000 | Hashimoto et al. ............ | 372/49 |
| 6,107,641 | A | * | 8/2000 | Mei et al. ...................... | 257/66 |

FOREIGN PATENT DOCUMENTS

| | | | | |
|---|---|---|---|---|
| JP | 58-079791 | * | 5/1983 | ............. H01S/3/18 |
| JP | 01-276686 | * | 7/1989 | ............. H01S/3/18 |
| JP | 11-186651 | * | 7/1999 | ............. H01S/3/18 |
| JP | 11-186656 | | 7/1999 | |

* cited by examiner

*Primary Examiner*—Paul Ip
*Assistant Examiner*—Tuan Nguyen
(74) *Attorney, Agent, or Firm*—Hogan & Hartson, LLP

(57) ABSTRACT

A monolithic two-wavelength semiconductor laser device includes a front end face film 19 on a resonator front end face 18, and a high-reflectivity end face film 22 as a multilayered film on a resonator rear end face 21. The front end face film 19 is formed using a low-refractive-index material, and the film thickness is so set that the reflectivity is 20%. The high-reflectivity end face film 22 is formed by alternately stacking thin films of low- and high-refractive-index materials, and the film thickness is so set that the reflectivity is 80%. The film thickness of each of these two end face films is calculated by an optical length $d=(¼+j)\times \lambda m$ by using a mean value $\lambda m=(\lambda 1+\lambda 2)/2$ of the oscillation wavelengths of the two semiconductor laser diodes. This makes it possible to obtain an end face film having a desired reflectivity and capable of being formed at once, and to fabricate a two-wavelength semiconductor laser device having high reliability, meeting the required performance, and also having high productivity.

12 Claims, 18 Drawing Sheets

SEMICONDUCTOR LASER DEVICE AND METHOD OF FABRICATING THE SAME

CROSS REFERENCE TO RELATED APPLICATIONS

This application claims benefit of priority under 35USC §119 to Japanese Patent Application No. 2000-69820, filed on Mar. 14, 2000, the entire contents of which are incorporated by reference herein.

BACKGROUND OF THE INVENTION

The present invention relates to a two-wavelength laser device which includes a front end face film and a high-reflectivity multilayered film and performs two-wavelength oscillation.

Optical disk systems currently put into practical use are roughly classified into a system which records and reproduces data into and from a compact disc and a DVD system which performs data recording and reproduction at higher density. An optical semiconductor laser used for a compact disc recording medium has an oscillation wavelength of 780 nm. An optical semiconductor laser used in the DVD system has an oscillation wavelength of 650 nm. To obtain a high optical output, each of these optical semiconductor lasers has a front end face anti-reflectivity film and a rear end face high-reflectivity film on its end faces, thereby efficiently extracting light, emitted from the rear surface of a resonator, from the front surface. The thicknesses of these front end face anti-reflectivity film and rear end face high-reflectivity film are calculated on the basis of the oscillation wavelength of each laser.

Recently, disk apparatuses including a high-density recording medium such as a DVD in addition to a CD-R, CD-RW, and the like have appeared. Some disk apparatuses of this type incorporate both an optical semiconductor laser having an oscillation wavelength of 780 nm and an optical semiconductor laser having an oscillation wavelength of 650 nm. However, since optical systems are required to shrink as disk apparatuses are miniaturized, two-wavelength lasers including two resonators having the above-mentioned two oscillation wavelengths in a single crystal structure are most often used.

In this two-wavelength laser, however, the film thicknesses of the front end face anti-reflectivity film and rear end face high-reflectivity film must be respectively matched with their wavelengths λ. This introduces inconveniences to the fabrication steps. FIGS. 32 and 33 show end face film formation steps relevant to the present invention. As shown in FIG. 32, semiconductor laser diodes having an oscillation frequency of 650 nm and semiconductor laser diodes having an oscillation frequency of 780 nm are alternately formed on a single chip. The front end faces of the 650-nm laser diodes 51 are exposed, and their other portions and the 780-nm laser diodes are covered with a mask 52. A single-layer reflecting film 54 is formed by sputtering on a laser emission portion 53 of each exposed end face. The film thickness of this single-layer reflecting film 54 is calculated on the basis of an oscillation frequency of 650 nm. Subsequently, as shown in FIG. 33, the mask 52 is moved to expose laser emission regions 56 at the front end faces of the 780-nm laser diodes 55, in order to form a thin film having a predetermined film thickness on these front end face emission regions 56. After that, a single-layer reflecting film having a film thickness calculated on the basis of an oscillation frequency of 780 nm is formed on the exposed portions.

In the above fabrication steps, the spacing between the two semiconductor lasers is set to around 100 μm in accordance with the effective dimensions of these optical semiconductor elements and the requirements of an optical system into which these optical semiconductor elements are incorporated. Therefore, the fabrication method which forms end face films by using the mask 52 is inefficient because the method requires highly accurate microfabrication. The working efficiency is also low because thin film formation is performed for each semiconductor laser. The working efficiency is similarly low when an end face high-reflectivity film is formed on the rear end face of each semiconductor laser. Furthermore, the mask 52 is very difficult to move since the planarity of the element surface is disturbed by the multilayered thin films already formed.

As a method of forming thin films without using any shielding masks, a thin film formation method using optical CVD or the like described in patent gazette (U.S. Pat. No. 2,862,037) is used. However, this method has the following problems. In the method using optical CVD, as shown in FIG. 34, a light amount control ND filter 62 for controlling the thin film growth rate is placed between a light source and the end face of a laser diode 61 on which a thin film is to be formed. Light emission regions 53 and 56 having the different oscillation wavelengths as described above are arranged with fine intervals between them. Therefore, lights 63 passing through the ND filter 62 must exactly irradiate desired light emission regions 53 and 56. Accordingly, the ND filter 62 and the light emission regions 53 and 56 require an extremely high level of positional adjustment. Any adjustment difference produces an error in thin film formation by a change in the light amount, and this greatly lowers the productivity.

Also, in the two formation steps described above, the structures of jigs and the mechanism of a reaction tank inside the film fabrication apparatus are elaborated in the process of forming films on optical semiconductor lasers. This degrades the flexibility of the apparatus.

SUMMARY OF THE INVENTION

It is, therefore, an object of the present invention to provide a two-wavelength semiconductor laser device having high reliability, meeting the necessary performance, and capable of forming a high-productivity end face reflecting film at one time.

A semiconductor laser device of the present invention is characterized by comprising a substrate, a first laser element portion formed on the substrate to oscillate laser light having a first wavelength, a second laser element portion formed on the substrate to oscillate laser light having a second wavelength, a front end face film formed at once on front end faces of the first and second laser element portions and having a uniform film thickness, and a rear end face film formed at once on rear end faces of the first and second laser element portions, having a uniform film thickness, and comprising a plurality of thin films, wherein the film thickness of the front end face film and the plurality of thin films of the rear end face film have an optical length $d=(\frac{1}{4}+j)\times\lambda$ (j=0, 1, 2, ...) with respect to a mean wavelength λ of the first and second wavelengths. This device is characterized in that the front end face film has a reflectivity of 3 to 37%, and the rear end face film has a reflectivity of not less than 75%. The device is also characterized in that the front end face film is made of a low-refractive-index material having a refractive index n<1.8, and the rear end face film comprises stacked layers of thin films made of a low-refractive-index material having a refractive index n<1.8 and thin films made of a high-refractive-index material having a refractive index n>1.9. Furthermore, the front end face film is made of $Al_2O_3$, and the rear end face film comprises stacked layers of thin films made of $Al_2O_3$ or $SiO_2$ as a low-refractive-index material and thin films made of $SiN_4$ or Si as a high-refractive-index material.

A semiconductor laser device fabrication method of the present invention comprises the step of forming, on a substrate, a first laser element portion which oscillates laser light having a first wavelength, forming, on the substrate, a second laser element portion which oscillates laser light having a second wavelength forming a front end face film having a uniform film thickness at once on front end faces of the first and second laser element portions by using electronic cyclotron resonance (ECR) sputtering, and forming a rear end face film having a uniform film thickness and comprising a plurality of thin films at once on rear end faces of the first and second laser element portions by using ECR sputtering.

The present invention can provide a semiconductor laser device having high reliability, meeting the necessary performance, and also having high productivity. It is also possible to provide a semiconductor laser device fabrication method capable of forming an end face film at once and thereby capable of reducing the number of fabrication steps and saving the space of the film formation apparatus.

DESCRIPTION OF THE PREFERRED EMBODIMENTS

In a monolithic two-wavelength semiconductor laser device including two oscillation wavelength regions, i.e., an oscillation wavelength λ1 of 650 nm and an oscillation wavelength λ2 of 730 nm on a single chip, when a laser diode having the oscillation wavelength λ1 is used for a DVD-ROM and a laser diode having the oscillation wavelength λ2 is used for a CD-ROM, the present invention can obtain a light oscillation output of 10 mW at a temperature of a maximum of 70° C. equally for these two laser diodes. For this purpose, end face films of the two laser diodes are characterized by having a film thickness calculated by using a mean value λm=(λ1+λ2)/2 of the two oscillation wavelengths as a design numerical value. Since the end face films of the two laser diodes have the same film thickness, these films can be formed on the two laser diodes at once. Accordingly, it is possible to provide a high-productivity monolithic two-wavelength laser device by simplifying the fabrication steps, e.g., obviating the need for dedicated jig sets corresponding to film formation in different wavelength bands.

Embodiments of the present invention will be described below with reference to the accompanying drawings.

Figure 1:
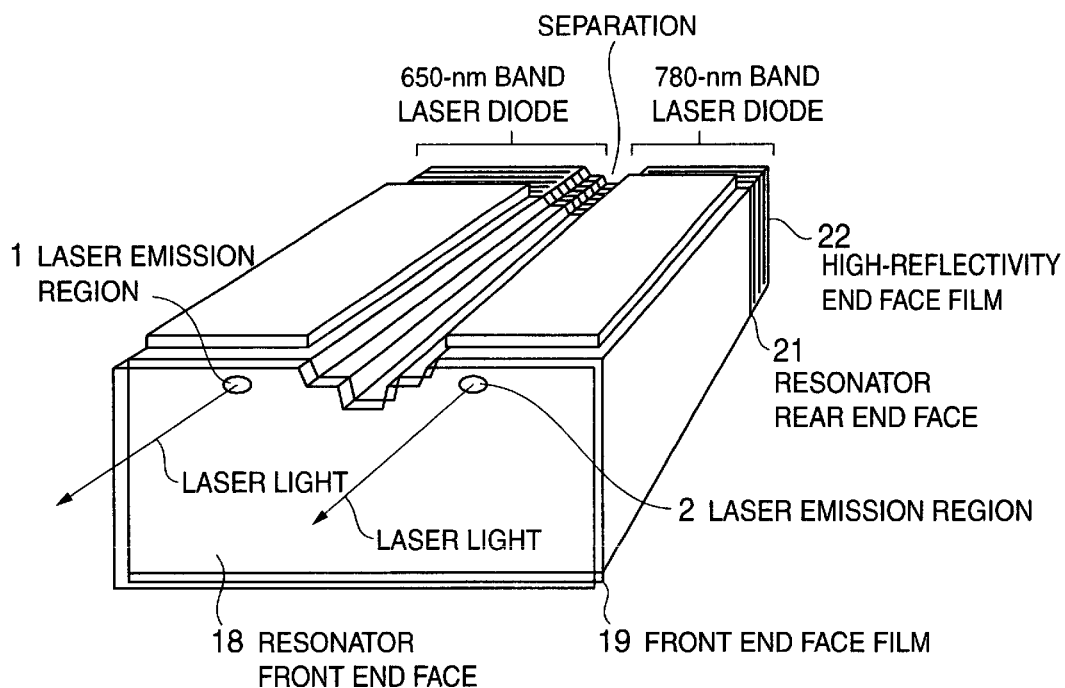
FIG. 1 is a schematic view showing the structure of a two-wavelength semiconductor laser of the present invention.

A two-wavelength semiconductor device according to the first embodiment of the present invention will be described. FIG. 1 is a schematic view showing the two-wavelength semiconductor laser device according to the first embodiment. A 650-nm band laser diode and a 780-nm band laser diode are formed on the same substrate. A laser emission region 1 of the 650-nm band laser diode and a laser emission region 2 of the 780-nm band laser diode are physically separated by wet etching using an acidic solution or by dry gas etching or the like. Since this facilitates independently driving the two laser diodes, this two-wavelength semiconductor laser device functions as a CD or DVD laser light source optimum for a limited space. That is, it is possible to prolong the operating life by eliminating the influence of heat generation which the two laser diodes have on each other, and to save energy by eliminating any electrical leak.

Figure 2:
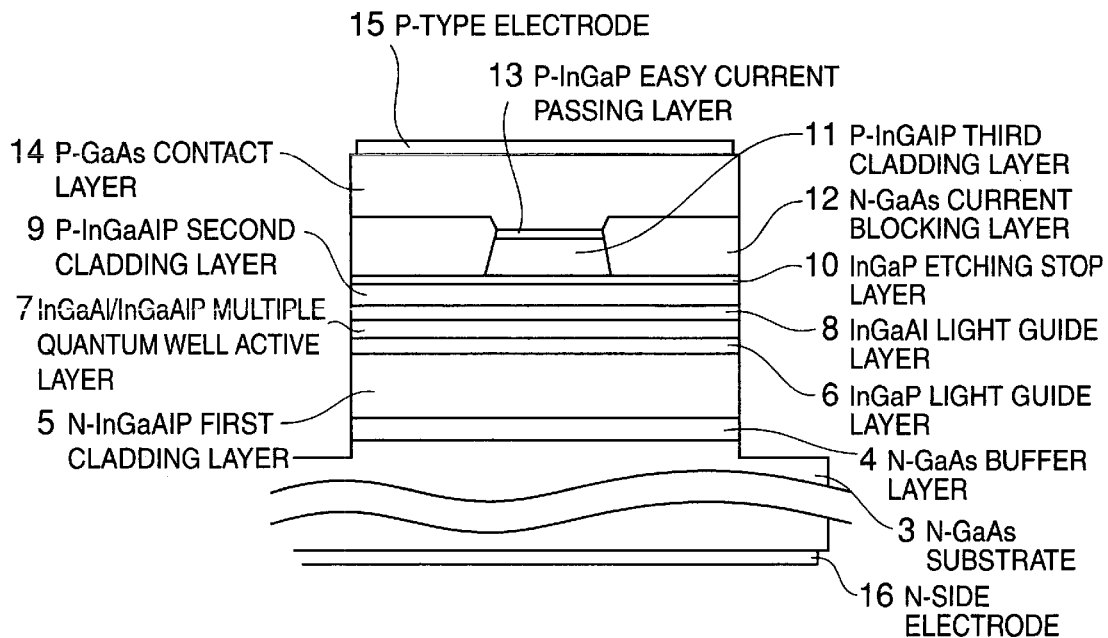
FIG. 2 is a sectional view showing the stacked structure of a laser diode having an oscillation wavelength of 650 nm according to the first embodiment of the present invention.

FIG. 2 shows the stacked structure of the 650-nm band laser diode having the laser emission region 1. An n-GaAs buffer layer 4, n-InGaAlP first cladding layer 5, an InGaAl light guide layer 6, an InGaAl/InGaAlP multiple quantum well active layer 7, an InGaAl light guide layer 8, a p-InGaAlP second cladding layer 9, and an InGaP etching stop layer 10 are sequentially formed on an n-GaAs substrate 3. A ridge-shaped p-InGaAlP third cladding layer 11 is formed on the etching stop layer 10. An n-GaAs current blocking layer 12 is formed on the two sides of this third cladding layer 11, and a p-InGaP easy current passing layer 13 is formed on top of the third cladding layer 11. A p-GaAs contact layer 14 is formed on the current blocking layer 12 and on the easy current passing layer 13. A p-type electrode 15 is formed on the contact layer 14, and an n-type electrode 16 is formed on the lower surface of the n-GaAs substrate 3. The optical semiconductor laser of this embodiment has an SBR (Selective Buried Ridge) structure by which laser diodes capable of maintaining a single transverse mode at high output can be formed with high productivity by setting the ridge width to 3 to 6 μm or less. This allows a condenser lens or the like to converge oscillated laser light to a narrow stop area on an optical disk. Hence, this laser diode is suitable as a high-output laser diode for optical disks.

Figure 3:
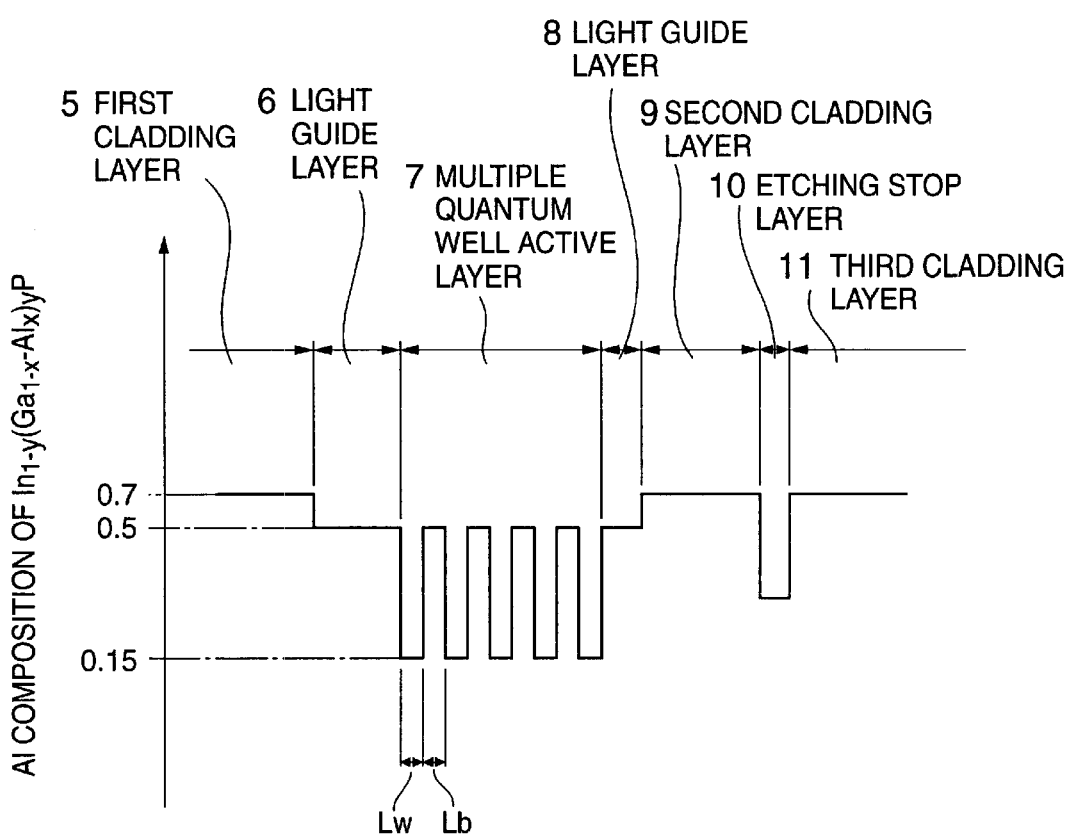
FIG. 3 is a view showing the energy bandgap of the laser diode having an oscillation wavelength of 650 nm according to the first embodiment of the present invention.

FIG. 3 shows the Al compositions near the multiple quantum well active layer 7 of the 650-nm band laser diode. The abscissa indicates the individual layers, and the ordinate indicates the Al compositions. The Al composition of the cladding layers 5, 9, and 11 is 0.7. The Al composition of barrier layers in the light guide layers 6 and 8 and the active layer 7 is 0.5. The Al composition of well layers in the active layer 7 is 0.15. A well layer thickness $L_w$ is 3 to 8 nm, a barrier layer thickness $L_b$ is 2 to 5 nm, a light guide layer thickness is 10 to 40 μm, and the divergence angle is 20 to 25°. As a consequence, an optical output having a CW oscillation of 30 mW or more can be stably obtained.

Figure 4:
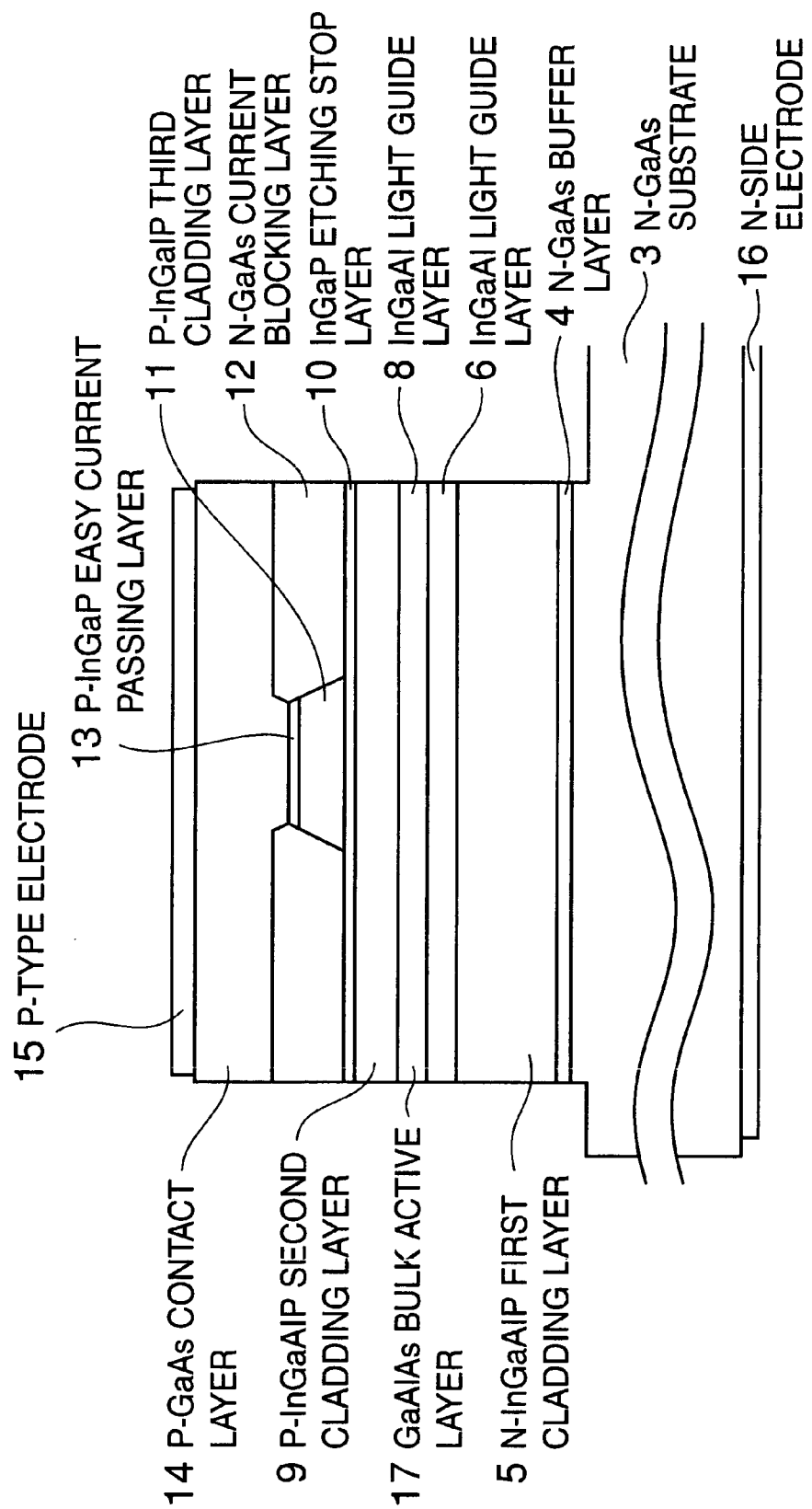
FIG. 4 is a sectional view showing the stacked structure of a laser diode having an oscillation wavelength of 780 nm according to the first embodiment of the present invention.

FIG. 4 shows the stacked structure of the 780-nm band laser diode having the laser emission region 2. An n-GaAs buffer layer 4, an n-InGaAlP first cladding layer 5, an InGaAl light guide layer 6, a bulk structure GaAlAs active layer 17, an InGaAl light guide layer 8, a p-InGaAlP second cladding layer 9, and an InGaP etching stop layer 10 are sequentially formed on an n-GaAs substrate 3. A ridge-shaped p-InGaAlP third cladding layer 11 is formed on the etching stop layer 10. An n-GaAs current blocking layer 12 is formed on the two sides of this third cladding layer 11, and a p-InGaP easy current passing layer 13 is formed on top of the third cladding layer 11. A p-GaAs contact layer 14 is formed on the current blocking layer 12 and on the easy current passing layer 13. A p-type electrode 15 is formed on the contact layer 14, and an n-type electrode 16 is formed on the lower surface of the n-GaAs substrate 3.

Figure 5:
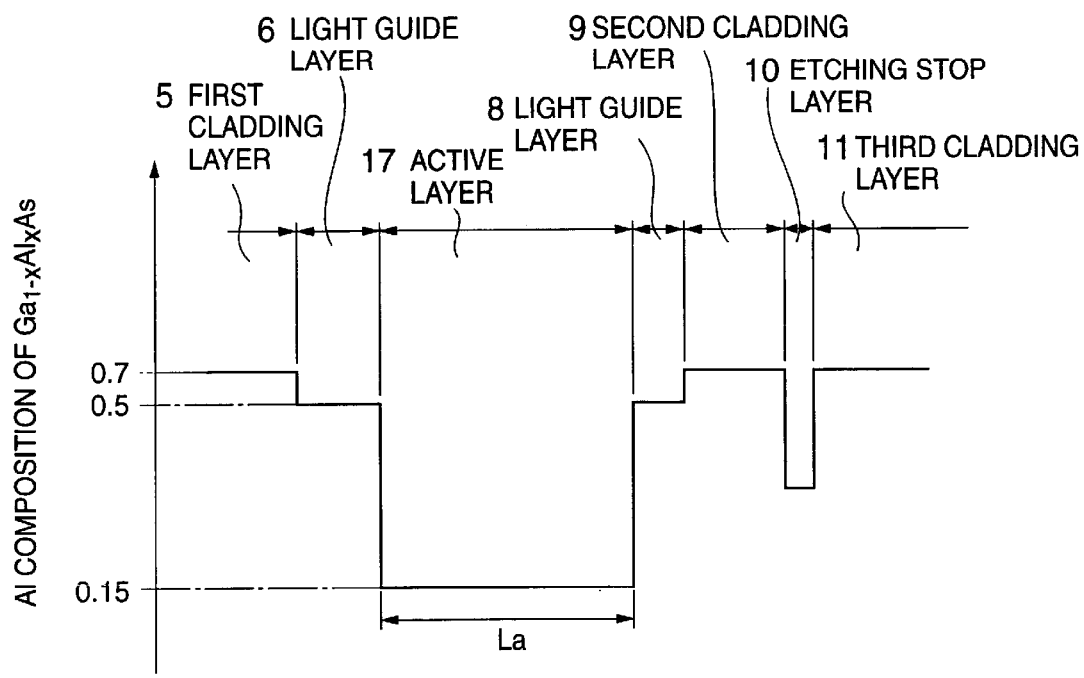
FIG. 5 is a view showing the energy bandgap of the laser diode having an oscillation wavelength of 780 nm according to the first embodiment of the present invention.

FIG. 5 shows the Al compositions near the active layer 17 of the 780-nm band laser diode. The active layer has a single-layer well structure having an Al composition of 0.1 to 0.2 and a layer thickness of 0.01 to 1 μm. This structure can reduce the bandgap discontinuity and obtain high productivity. Also, by adjusting the Al composition and active layer thickness within the above ranges, it is possible to obtain a 780-nm oscillation laser diode having a horizontal divergence angle=7° to 10° and a vertical divergence angle= 20° to 30° suited to optical disks, and also having high reliability.

As described above, InGaAlP is used as the cladding layers in both the 650-nm and the 780-nm band laser diodes of the two-wavelength laser according to this embodiment. Therefore, the ridges of these two elements can be simultaneously formed by patterning, and the directions of the two laser beams can be matched with high accuracy substantially equal to the ridge mask patterns.

Figure 6:
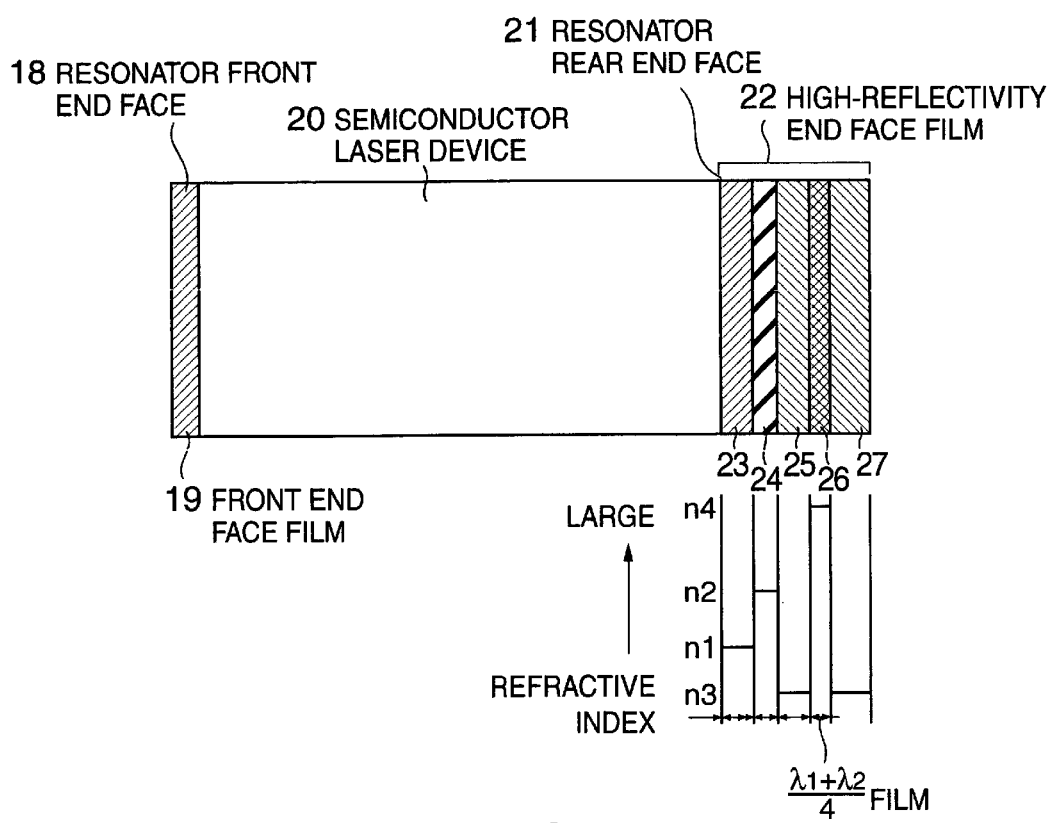
FIG. 6 is a view showing the end face film structure of the two-wavelength semiconductor laser according to the first embodiment of the present invention.

FIG. 6 shows the end face film structure as the characteristic feature of the present invention. A resonator front end face 18 of a semiconductor laser device 20 has a front end face film 19 having a reflectivity of 20%. A resonator rear end face 21 has a multilayered, high-reflectivity end face film 22 having a reflectivity of 80%. The combination of the reflectivities of these end face films 19 and 22 has high reliability and can obtain a monitor current required for a DVD-ROM laser. The first embodiment is characterized in that the film thicknesses of the front end face film 19 and the high-reflectivity end face film 22 is calculated on the basis of the mean value of the oscillation wavelengths of the two laser diodes.

The front end face film 19 is made of a low-refractive-index material having a refractive index n<1.8, preferably 1.7 or less. By the use of this low-refractive-index material, a single-layer film having a relatively large film thickness and high controllability can be obtained, and high productivity can be obtained. $Al_2O_3$ is preferred as this low-refractive-index material. Since a linear expansion coefficient of 6.6 of $Al_2O_3$ is close to a linear expansion coefficient of 7.7 of GaAs, the $Al_2O_3$ front end face film 19 readily gets intimate with and is highly adhesive to a device containing GaAs as its main constituent substance. The film thickness of this front end face film 19 is calculated by an optical film thickness $d=(¼+j)\times \lambda m$ (j=0, 1, 2, . . . ) by using the mean oscillation wavelength $\lambda m=(\lambda 1+\lambda 2)/2$ of the laser diode having the oscillation wavelength $\lambda 1=780$ nm and the laser diode having the oscillation wavelength $\lambda 2=650$ nm, i.e., $\lambda m=715$ nm. By the use of the mean wavelength, the front end face film 19 having a uniform film thickness and a reflectivity of 20% can be formed on the two front end faces of the 650-nm oscillation laser diode and the 780-nm oscillation laser diode. This front end face film 19 is formed at once by ECR (Electron Cyclotron Resonance) sputtering. ECR sputtering is proposed by Japanese Patent Laid-Open No. 9-162496 and reference (Kiyotake Tanaka et al., Manuscripts for The 44th Applied Physics Related Joint Lecture Meeting, 31-NG-7, 1997). This method can simplify the fabrication steps and obviates the need for a conventional large-scaled film formation system. Also, since the film is formed at one time, film formation which reduces damage to the laser emission regions is possible. Consequently, a highly reliable semiconductor laser device can be provided.

The resonator rear end face 21 of the semiconductor laser device has the high-reflectivity end face film 22. This high-reflectivity end face film 22 is formed by sequentially stacking, from the resonator rear end face 21, a first film 23 made of the same material as the front end face film 19, a second film 24 made of a high-refractive-index material having a refractive index of 2.0 or more, a third film 25 made of a low-refractive-index material having a refractive index of 1.7 or less, a fourth film 26 made of a high-refractive-index material having a refractive index of 2.0 or more, and a fifth film 27 using the low-refractive-index material of the third film 25. The reflectivity of this high-reflectivity end face film 22 is 75 to 85%, preferably 80%. The materials of the high-reflectivity end face film 22 are preferably $Al_2O_3$, $SiN_2$, $SiO_2$, and Si. These materials are stacked in the order of $Al_2O_3$, $SiN_2$, $SiO_2$, Si, and $SiO_2$ from the resonator rear end face. The refractive indices of $Al_2O_3$ and $SiO_2$ as low-refractive-index materials are 1.7 and 1.5, respectively. The refractive indices of Si and $SiN_2$ as high-refractive-index materials are 4.5 and 2.0, respectively. The film thicknesses of these low-refractive-index material film and high-refractive-index material films are calculated by the optical film thickness $d=(¼+j)\times(j=0, 1, 2, . . . )$ by using the means oscillation wavelength $\lambda m=(\lambda 1+\lambda 2)/2$ of the laser diode oscillation wavelengths $\lambda 1=780$ nm and $\lambda 2=650$ nm, i.e., $\lambda m=715$ nm. By the use of the mean wavelength, the high-reflectivity end face film 22 having a uniform film thickness can be formed at one time on the two end faces of the 650-nm oscillation laser diode and the 780-nm oscillation laser diode. By setting the number of thin-film stacked layers of the high-reflectivity end face film 22 to 5 or less, problems caused by an increase in the number of stacked layers can be eliminated. That is, it is possible to reduce stress between the high-reflectivity end face film 22 and a semiconductor layer or between the thin-film layers in the high-reflectivity end face film 22, to prevent film peeling, and to prevent deterioration of the device end face. Also, the high-reflectivity end face film 22 obtains a desired reflectivity of 80% by adding one Si layer having light absorbing properties and yet having a high refractive index. The film thickness of the outermost fifth film 27 is so adjusted that the added reflectivity is 80%.

The method of forming the high-reflectivity end face film 22 of this embodiment uses ECR sputtering, as in the formation of the front end face film 19. By this method, a film of a desired one of thin-film materials $Al_2O_3$, $SiO_2$, Si, and $SiN_4$ can be formed by using two targets, i.e., Al and Si, and appropriately switching material gases $O_2$ and $N_2$ necessary in the film formation. Compared to a process which forms films by using dedicated targets for individual materials, the productivity can be dramatically improved.

The combination of a reflectivity of 20% of the front end face film 19 and a reflectivity of 80% of the high-reflectivity end face film 22 is highly reliable and makes it possible to obtain a monitor current required for a DVD-ROM laser. Also, even when the film thicknesses of the front end face film 19 and the high-reflectivity end face film 22 more or less vary, their reflectivities do not deviate from their predetermined values. Therefore, end face films having very high productivity can be provided. On the other hand, if the film thicknesses of the front end face film 19 and the high-reflectivity end face film 22 are not calculated by using the mean wavelength, i.e., if they are calculated using the oscillation wavelengths $\lambda 1=650$ nm and $\lambda 2=780$ nm, the reflectivities vary with variations in the film thicknesses. Accordingly, no reliable semiconductor laser device can be provided. This will be verified below.

Figure 7:
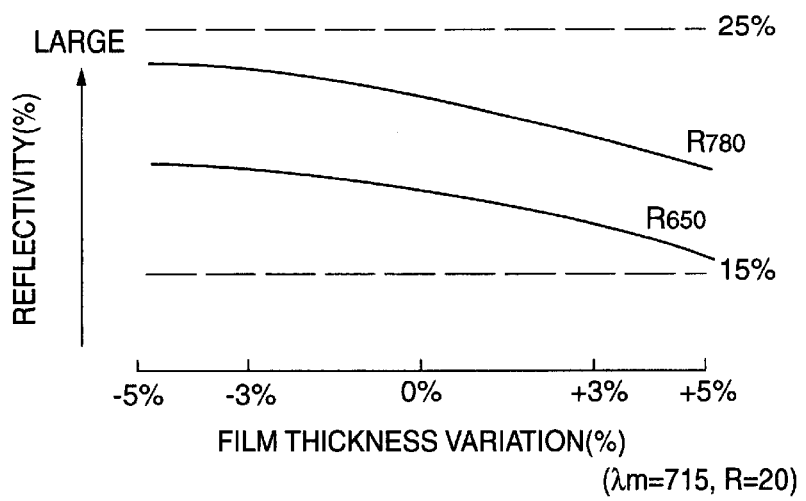
FIG. 7 is a graph showing changes in reflectivity of a front end face film at different wavelengths according to the first embodiment of the present invention.
Figure 8:
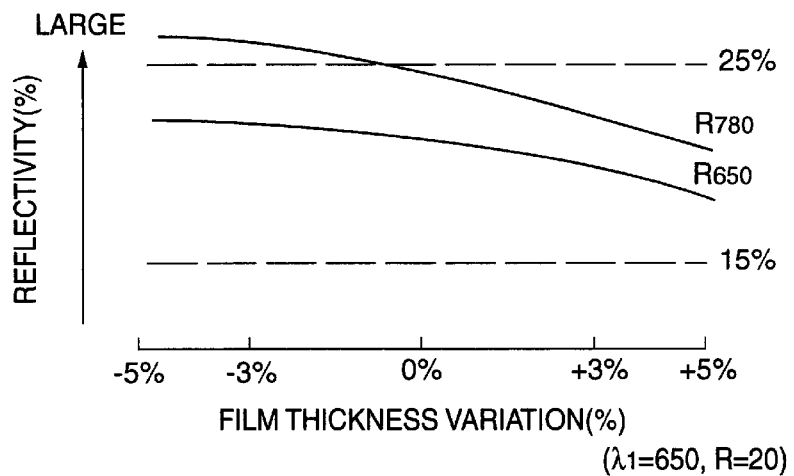
FIG. 8 is a graph showing changes in reflectivity of the front end face film at different wavelengths according to the first embodiment of the present invention.
Figure 9:
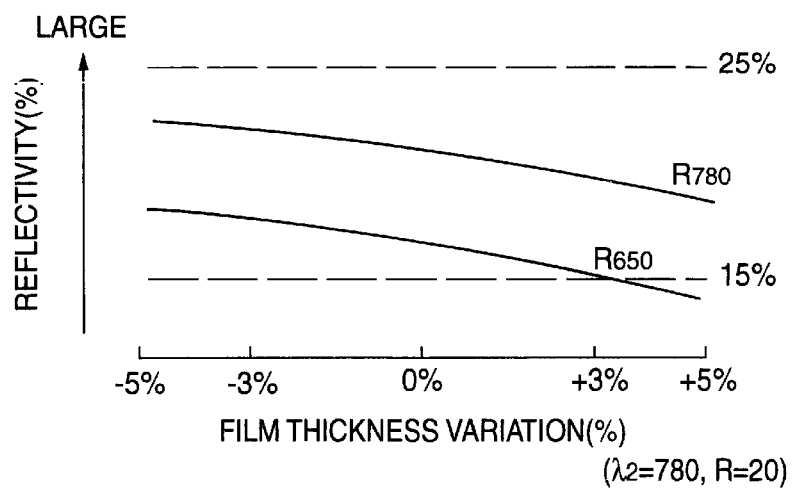
FIG. 9 is a graph showing changes in reflectivity of the front end face film at different wavelengths according to the first embodiment of the present invention.

FIGS. 7 to 9 show the results of trial calculations of reflectivities as functions of variations in the film thickness of the front end face film 19. FIG. 7 shows changes in reflectivities when the film thickness is calculated on the basis of a design wavelength of 715 nm to obtain a reflectivity R=20%. When the film thickness has no variation, a reflectivity $R_{650}$ of the 650-nm laser diode is 19%, and a reflectivity $R_{780}$ of the 780-nm laser diode is 22%. Even when the film thickness has a variation of ±5% from the calculated value, the reflectivities fall within the range of 15% to 25%. Therefore, appropriate reflectivities are obtained even when the film thickness calculated on the basis of the design central wavelength of 715 nm has a variation of ±5%.

FIG. 8 shows the reflectivity as a function of variations in the film thickness when the design wavelength $\lambda 1=650$ nm is used to calculate the film thickness for obtaining a reflectivity R=20%. When the film thickness variation is ±5%, the reflectivity $R_{650}$ of the semiconductor laser having an oscillation wavelength of 650 nm falls within the practical range of 15% to 25%. However, if the film thickness varies from the desired value to negative values, the reflectivity $R_{780}$ of the semiconductor laser having an oscillation wavelength of 780 nm exceeds the practical range of 15% to 25%.

FIG. 9 shows the reflectivity as a function of variations in the film thickness when the design wavelength $\lambda 2=780$ nm is used to calculate the film thickness for obtaining a reflectivity R=20%. When the film thickness variation is ±5%, the reflectivity $R_{780}$ of the semiconductor laser having an oscillation wavelength of 780 nm falls within the practical range of 15% to 25%. However, if the film thickness varies from the desired value to positive values, the reflectivity $R_{650}$ of the semiconductor laser having an oscillation wavelength of 650 nm exceeds the practical range of 15% to 25%.

From the foregoing, the front end face film 19 having a film thickness calculated by using the mean wavelength, i.e., the design wavelength $\lambda m=715$, has an appropriate reflectivity even when the film thickness varies.

Figure 10:
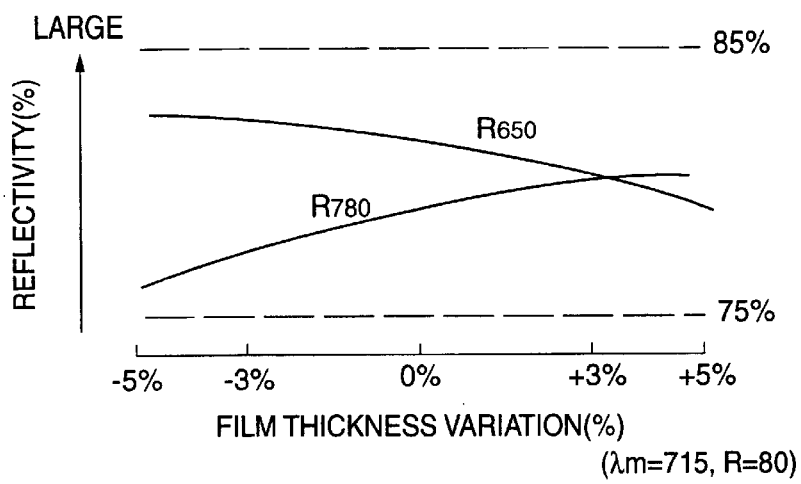
FIG. 10 is a graph showing changes in reflectivity of the high-reflectivity end face film at different wavelengths according to the first embodiment of the present invention.
Figure 11:
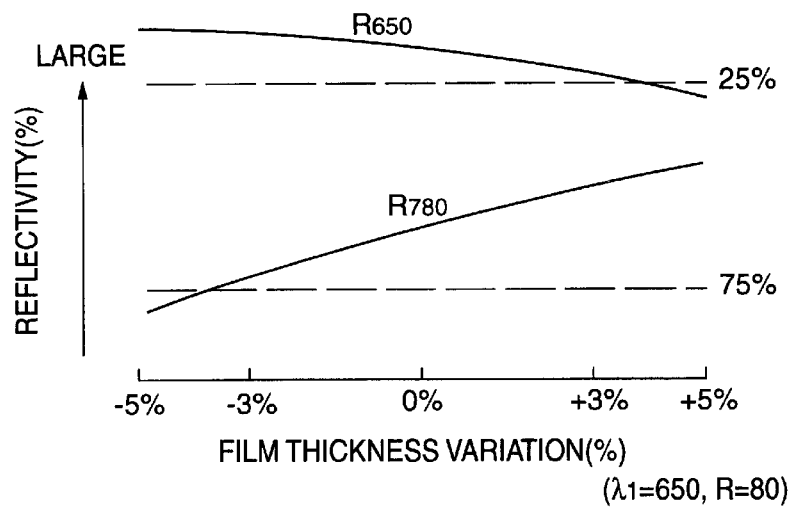
FIG. 11 is a graph showing changes in reflectivity for different wavelengths of the high-reflectivity end face film according to the first embodiment of the present invention.
Figure 12:
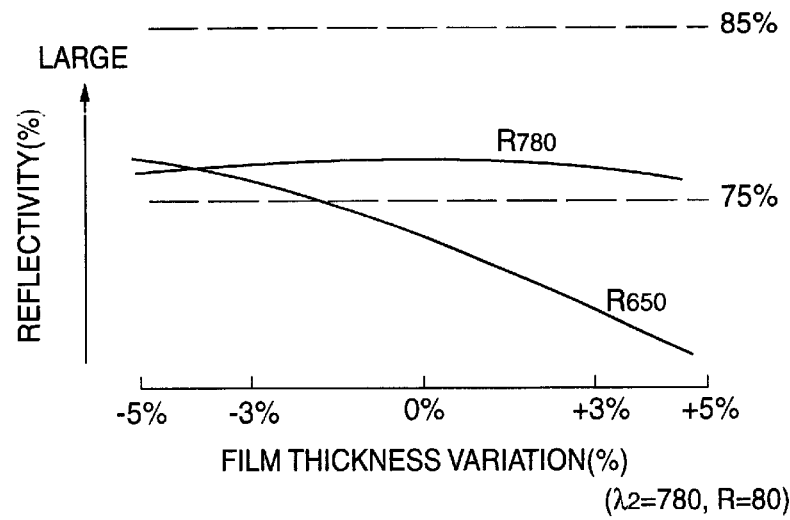
FIG. 12 is a graph showing changes in reflectivity for different wavelengths of the high-reflectivity end face film according to the first embodiment of the present invention.

The high-reflectivity end face film 22 will be similarly verified below. This high-reflectivity end face film 22 is a multilayered film having five layers. Therefore, the possibility that reflectivity differences produced by film thickness errors of the individual thin films add up to make the overall reflectivity difficult to control cannot be ignored. FIGS. 10 to 12 show the reflectivity as a function of variations in the film thickness of the high-reflectivity end face film 22.

FIG. 10 shows the reflectivity when the average wavelength, i.e., the design wavelength $\lambda m=715$ nm is used to calculate a film thickness for obtaining a reflectivity of approximately 80%. When the film thickness has no variation, the reflectivity $R_{650}$ of the 650-nm laser diode is 80%, and the reflectivity $R_{780}$ of the 780-nm laser diode is 79%. That is, the reflectivities of these two semiconductor lasers fall within the practical range of 80±5%. Even when the film thickness has a variation of ±5% from the calculated value, the reflectivities fall within the range of 80±5%. Therefore, appropriate reflectivities are obtained even when the film thickness calculated on the basis of the design wavelength of 715 nm has a variation of ±5%.

FIG. 11 shows the reflectivity as a function of variations in the film thickness when the design wavelength $\lambda 1=650$ nm is used to calculate the film thickness for obtaining a reflectivity of approximately 80%. When the film thickness variation is ±5%, the reflectivity $R_{650}$ of the semiconductor laser having an oscillation wavelength of 650 nm exceeds the practical range of 80±5%. Also, if the film thickness varies from the desired value to negative values, the reflectivity $R_{780}$ of the semiconductor laser having an oscillation wavelength of 780 nm exceeds the practical range of 80±5%.

FIG. 12 shows the reflectivity as a function of variations in the film thickness when the design wavelength $\lambda 2=780$ nm is used to calculate the film thickness for obtaining a reflectivity of approximately 80%. When the film thickness variation is ±5%, the reflectivity $R_{780}$ of the semiconductor laser having an oscillation wavelength of 780 nm falls within the practical range of 80±5%. However, if the film thickness varies from the desired value to positive values, the reflectivity $R_{650}$ of the semiconductor laser having an oscillation wavelength of 650 nm exceeds the practical range of 80±5%.

Accordingly, the high-reflectivity end face film 22 having the film thickness calculated by using the design wavelength $\lambda m=715$ has a reflectivity within the practical range even when the film thickness varies.

From the foregoing, when the end face film thickness is calculated using the mean value $\lambda m=715$ nm, an end face film having a uniform film thickness and a desired reflectivity can be formed on the two semiconductor laser diodes at once. In addition, even when the film thickness of the end face film varies ±5% from the calculated value, the two laser diodes can have reflectivities within the practical range. A two-wavelength semiconductor laser device having an end face film with the above film thickness can regularly oscillate 10 to 20 mW at a temperature of 70° C., and has a small light absorption and low loss.

Figure 13:
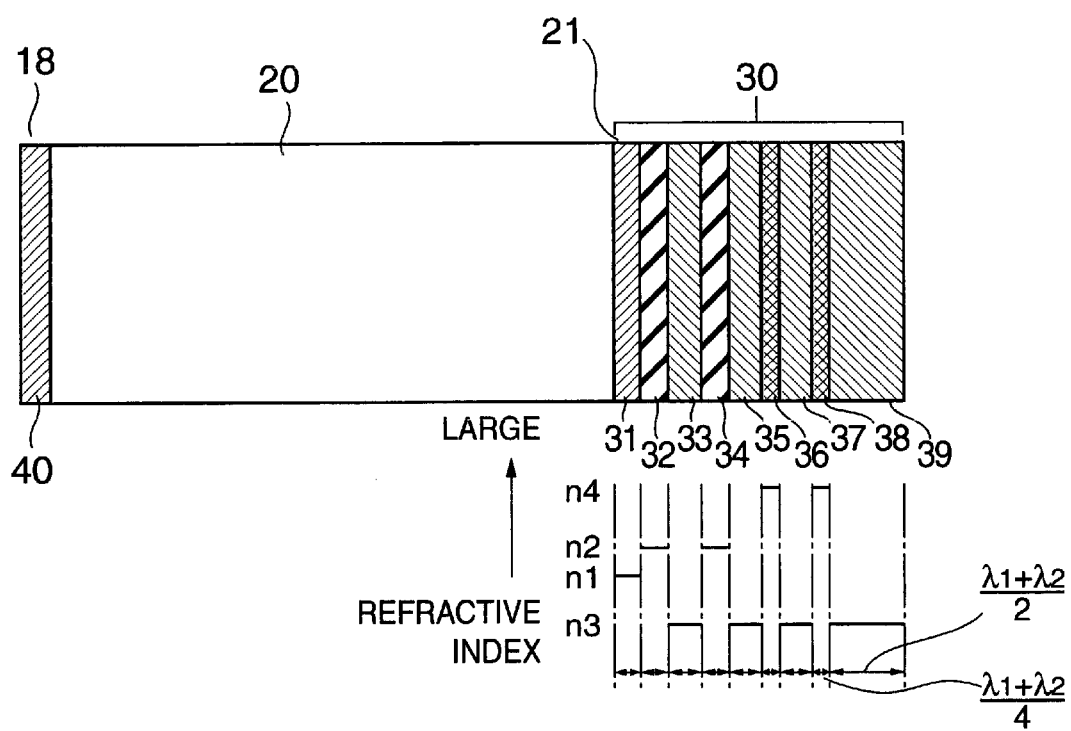
FIG. 13 is a view showing the end face film structure of a two-wavelength semiconductor laser according to the second embodiment of the present invention.

The second embodiment will be described below. FIG. 13 shows the structure of an end face film of a two-wavelength semiconductor laser according to the second embodiment. This second embodiment differs from the first embodiment in that a mean value $\lambda m=(\lambda 1+\lambda 2)/2$, i.e., $\lambda m=715$ nm of the oscillation wavelengths of two semiconductor laser diodes is used to obtain a film thickness by which the reflectivity of a front end face film 40 is a few % to 10% and the reflectivity of a high-reflectivity end face film 30 is 90% or more. The second embodiment also differs from the first embodiment in that the high-reflectivity end face film 30 has a stacked structure including nine low- and high-refractive-index films. Since the end face films have film thicknesses calculated by using the mean wavelength, a semiconductor laser device optimum as a light source for a DVD-ROM and for a CD-R of a double speed or higher can be provided.

Figure 14:
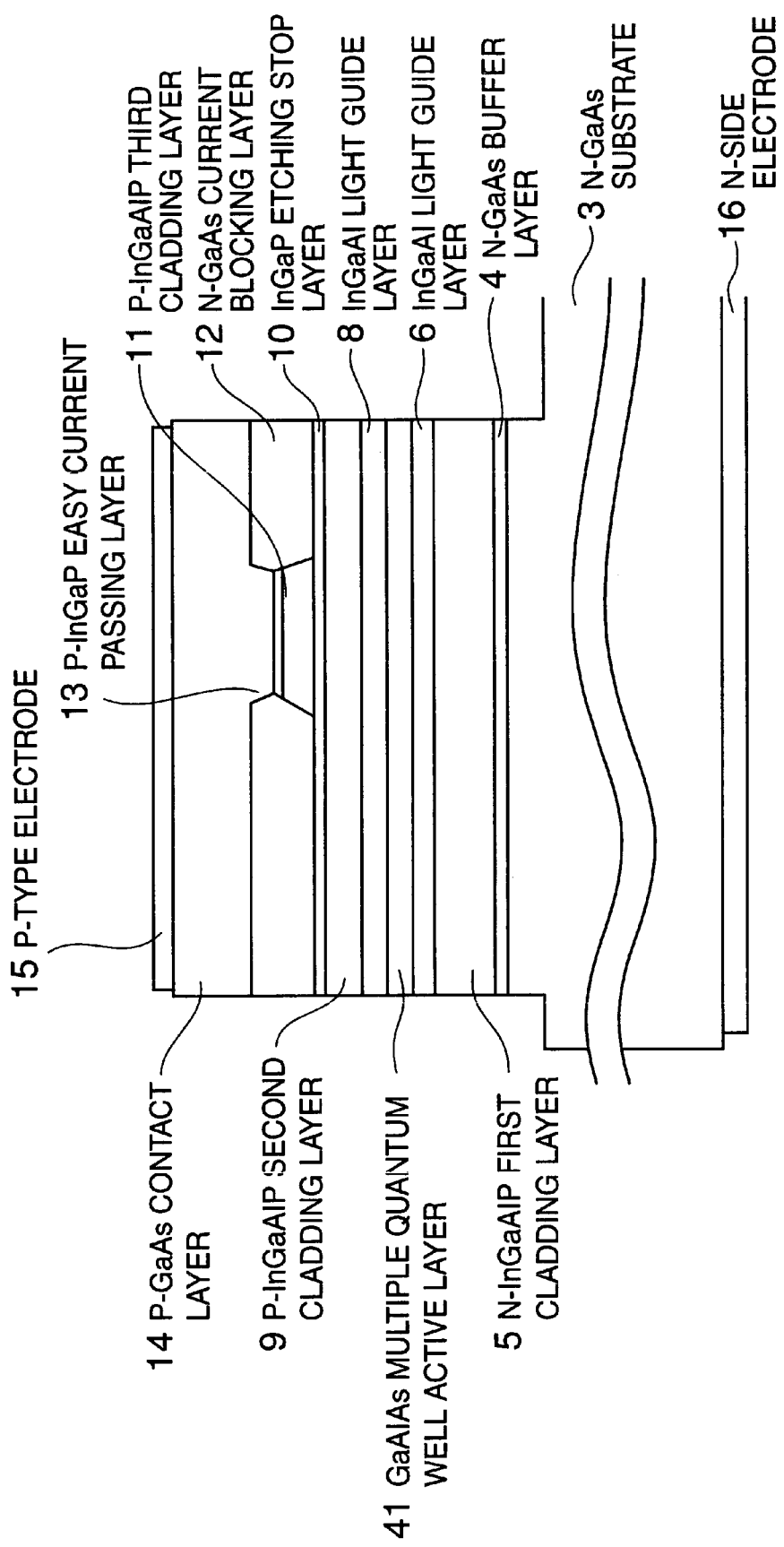
FIG. 14 is a sectional view showing the stacked structure of a laser diode having an oscillation wavelength of 780 nm according to the second embodiment of the present invention.
Figure 15:
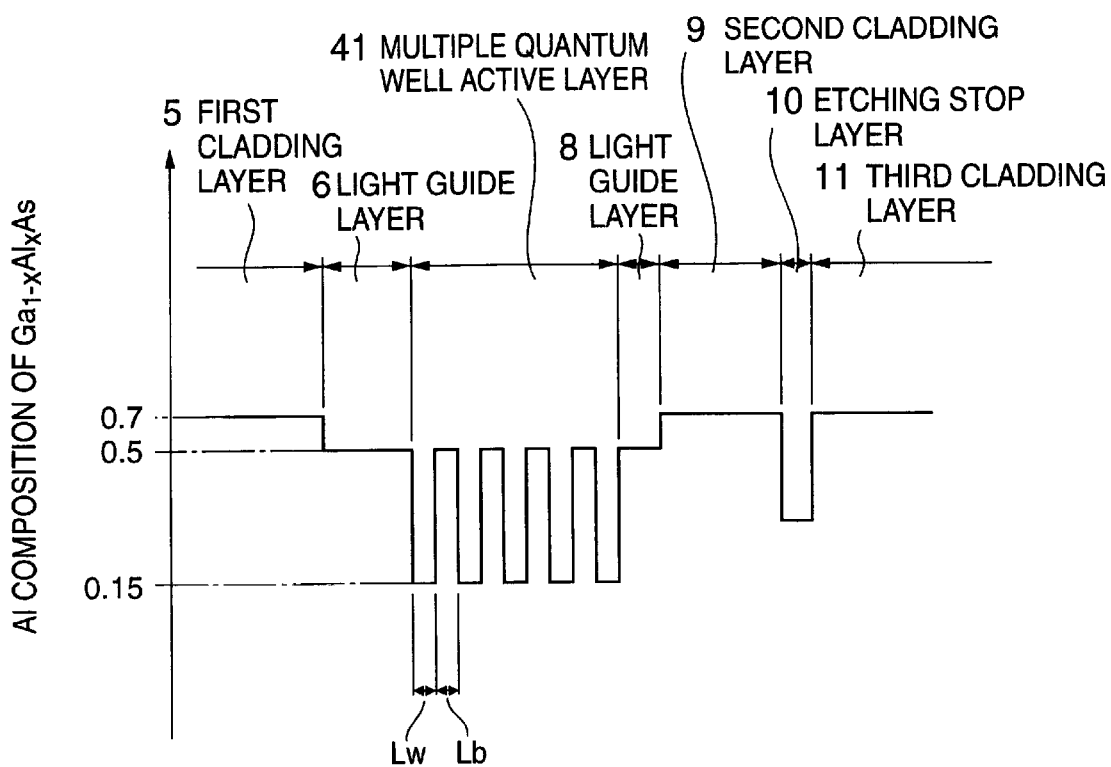
FIG. 15 is a view showing the energy bandgap of the laser diode having an oscillation wavelength of 780 nm according to the second embodiment of the present invention.

Similar to the first embodiment, the two-wavelength lasers according to the second embodiment are formed on a single device, and their laser emission regions are physically separated by wet etching using an acidic solution or by dry gas etching or the like. The stacked structure of a laser diode having an oscillation wavelength of 650 nm is analogous to the structure of the first embodiment, i.e., has an InGaAl/InGaAlP multiple quantum well active layer. Also, this structure is an SBR (Selectively Buried Ridge) structure by which lasers capable of maintaining a single transverse mode at high output can be formed with high productivity by setting the ridge width to 3 to 6 $\mu$m or less. Since this stacked structure is identical with the first embodiment, a detailed description thereof will be omitted. FIG. 14 shows the stacked structure of a laser diode having an oscillation wavelength of 780 nm. In FIG. 14, the same reference numerals as in the first embodiment denote the same parts. An n-GaAs buffer layer 4, an n-InGaAlP first cladding layer 5, an InGaAl light guide layer 6, a GaAlAs multiple quantum well active layer 42, an AlGaAs light guide layer 8, a p-InGaAlP second cladding layer 9, and an InGaP etching stop layer 10 are sequentially formed on an n-GaAs substrate 3. A ridge-shaped p-InGaAlP third cladding layer 11 is formed on the etching stop layer 10. An n-GaAs current blocking layer 12 is formed on the two sides of this third cladding layer 11, and a p-InGaP easy current passing layer 13 is formed on top of the third cladding layer 11. A p-GaAs contact layer 14 is formed on the current blocking layer 12 and on the easy current passing layer 13. A p-type electrode 15 is formed on the contact layer 14, and an n-type electrode 16 is formed on the lower surface of the n-GaAs substrate 3. The structure of the second embodiment is an SBR structure. Different from the first embodiment in which the active layer has a bulk structure, the active layer of this second embodiment has an AlGaAs multiple quantum well structure. Well layers in the active layer are $Al_{x1}Ga_{1-x1}As$, and barrier layers and light guide layers are $Al_{x2}Ga_{1-x2}As$. FIG. 15 shows the Al compositions of the multiple quantum well structure. The Al composition of the well layers is 0.15, and the Al composition of the barrier layers and light guide layers is 0.5. A well layer thickness $L_x$ is 3 to 8 nm, and a barrier layer thickness $L_b$ is 2 to 5 nm. These parameters can be properly adjusted. As a consequence, it is possible to obtain a laser diode suitable for optical disks, which has a continuous oscillation of 30 mW or more, a horizontal divergence angle of 7° to 10°, and a vertical divergence angle of 20° to 25°.

The end face film structure as the characteristic feature of the present invention will be described below. The structure is shown in FIG. 13 in which the same reference numerals as in the first embodiment denote the same parts. A resonator front end face 18 of each of the two semiconductor lasers has the front end face film 40 having a reflectivity of a few % to 10%. A resonator rear end face 21 of each laser has the high-reflectivity end face film 30 having a reflectivity of 90% or more. The combination of the reflectivities of these end face films allows the 780-nm band laser diode to perform high-output laser oscillation at 30 mW or more and to be used as a light source for a CD-R of a double speed or higher. Also, the 650-nm laser diode can be used as an optimum light source for a DVD-ROM.

As in the first embodiment, the front end face film 40 is made of a low-refractive-index material having a refractive index n<1.8, preferably 1.7 or less, and an example is $Al_2O_3$. By the use of this low-refractive-index material, a single-layer film having a relatively large film thickness and high controllability can be obtained, and the productivity also improves. A linear expansion coefficient of 6.6 of $Al_2O_3$ is close to a linear expansion coefficient of 7.7 of GaAs. Therefore, this $Al_2O_3$ front end face film has high intimacy and strong adhesion as a thin film in contact with a laser diode end face containing GaAs as its main constituent substance. The film thickness of this front end face film 40 is calculated by d (film thickness)=(¼+j)×λm (j=0, 1, 2, ...) by using the mean value λm=(λ1+λ2)/2 of the oscillation wavelengths of the two laser diodes, i.e., λm=715 nm. A semiconductor laser device having the above film thickness has a reflectivity of a few % to 10% at the front end faces of both the 650-nm oscillation laser diode and the 780-nm oscillation laser diode. Compared to the first embodiment, therefore, a larger amount of laser light can be extracted from these front end faces, and this reduces the load on the laser diodes. Also, the front end face film 40 can be formed on the resonator front end face 18 at once by ECR sputtering. This method allows film formation which reduces damage to the laser emission regions. Consequently, a highly reliable semiconductor laser device can be provided.

The resonator rear end face 21 has the high-reflectivity end face film 30 having a reflectivity of 90% or more. This high-reflectivity end face film 30 includes nine layers formed in the following order from the resonator rear end face 21: a first film 31 using a low-refractivity-index material having a refractive index of 1.7 or less, a second film 32 using a high-refractive-index material having a refractive index of 2.0 or more, a third film 33 using a low-refractive-index material, a fourth film 34 using the same high-refractive-index material as the second film, a fifth film 35 using the same low-refractive-index material as the third film, a sixth film 36 using a high-refractive-index material, a seventh film 37 using the same low-refractive-index material as the third film, an eighth film 38 using the same high-refractive-index material as the sixth film, and a ninth film 39 using the same low-refractive-index material as the third film. The materials are preferably $Al_2O_3$, $SiN_2$, $SiO_2$, and Si. These materials are stacked in the order of $Al_2O_3$, $SiN_2$, $SiO_2$, $SiN_2$, $SiO_2$, Si, $SiO_2$, Si, and $SiO_2$ from the semiconductor element. As in the case of the front end face film 40, the film thicknesses of these low-refractive-index material films and high-refractive-index material films are calculated by the optical film thickness d=(¼+j)×(j=0, 1, 2, ...) by using the mean oscillation wavelength λm=(λ1+λ2)/2 of the laser diode oscillation wavelengths λ1=780 nm and λ2=650 nm, i.e., λm=715 nm. The outermost ninth film 39 is formed to protect the films up to the eighth film 38 against chemical changes. The film thickness of this outermost ninth film 39 is so calculated that the ninth film 39 functions as a total reflection film in order to maintain the reflectivities up to the eighth layer. The mean wavelength of 715 nm is used in the calculation.

In the second embodiment, a film having a reflectivity of 90% or more is formed by setting the total number of thin-film stacked layers to 9 or less and forming the sixth film 36 and the eighth film 38 by using Si which absorbs light.

A desired film thickness of the high-reflectivity end face film 30 is obtained by using two, Al and Si targets by ECR sputtering, and appropriately switching $O_2$ and $N_2$ as material gases necessary in the film formation. Compared to a process which forms films by using dedicated targets for individual materials, the productivity can be dramatically improved. The combination of the front end face film 40 having a reflectivity of a few % to 10% and the high-reflectivity end face film 30 having a reflectivity of 90% or more can provide a 650-nm and laser diode optimum as a light source for a DVD-ROM and a 780-nm band laser diode optimum as a light source for a CD-R of a double speed or higher. Also, even when the film thickness of the high-reflectivity end face film 30 and the film thickness of the low-refractivity-index film 40 more or less vary, their reflectivities do not deviate from their predetermined values. Therefore, end face films having very high productivity can be provided.

As in the first embodiment, the front end face film 40 and the high-reflectivity end face film 30 have film thicknesses calculated by using the mean wavelength. Hence, desired reflectivities are obtained even if these film thicknesses more or less vary. This will be explained below.

Figure 16:
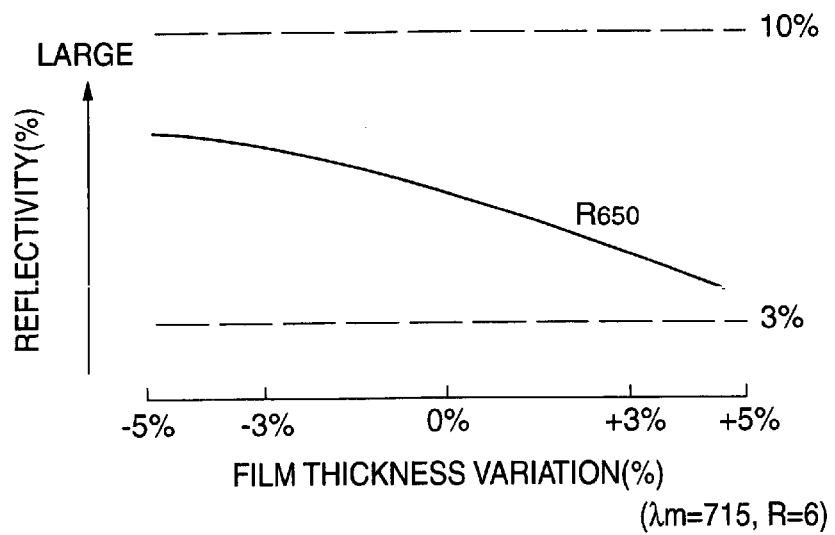
FIG. 16 is a graph showing changes in reflectivity of a front end face film at different wavelengths according to the second embodiment of the present invention.
Figure 17:
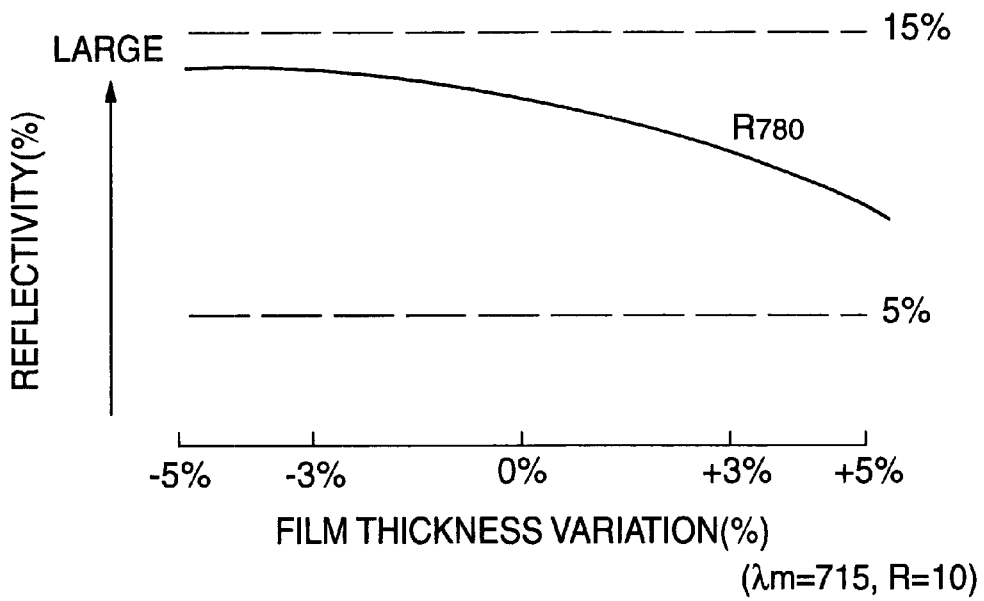
FIG. 17 is a graph showing changes in reflectivity of the front end face film at different wavelengths according to the second embodiment of the present invention.

FIGS. 16 to 21 show the results of trial calculations of the reflectivity as a function of variations in the film thickness of the front end face film 40. FIGS. 16 and 17 show the reflectivity when the film thickness is calculated on the basis of the design wavelength of 715 nm. The film thickness is so calculated that the reflectivity R=6% in the laser diode having the oscillation wavelength λ1=650 nm and the reflectivity R=10% in the laser diode having the oscillation wavelength λ2=780 nm. Even when this is the case, a front end face film 40 having a uniform film thickness can be formed at one time. When the desired film thickness is obtained, a reflectivity $R_{650}$ of the 650-nm semiconductor laser is 6% (FIG. 16), and a reflectivity $R_{780}$ of the 780-nm semiconductor laser is 11% (FIG. 17). When the film thickness has a variation of ±5%, the reflectivity of the 650-nm semiconductor laser falls within the practical range of $3\% \leq R_{650} \leq 10\%$ (FIG. 16), and the reflectivity of the 780-nm semiconductor laser falls within the practical range of $5\% \leq R_{780} \leq 15\%$ (FIG. 17). Therefore, appropriate reflectivities are obtained even when the film thickness calculated on the basis of the design wavelength of 715 nm has a variation of ±5%.

Figure 18:
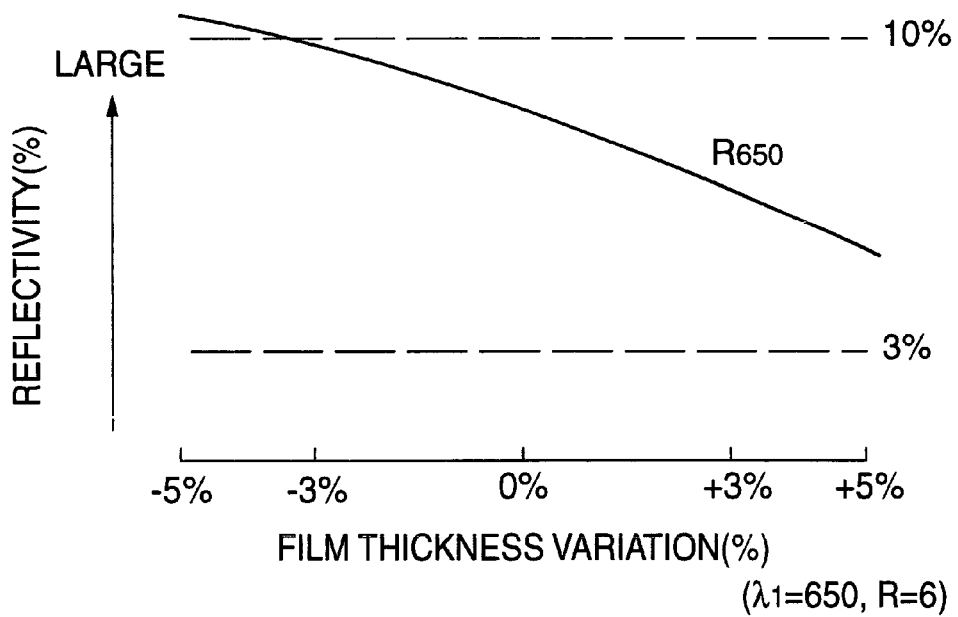
FIG. 18 is a graph showing changes in reflectivity of the front end face film at different wavelengths according to the second embodiment of the present invention.
Figure 19:
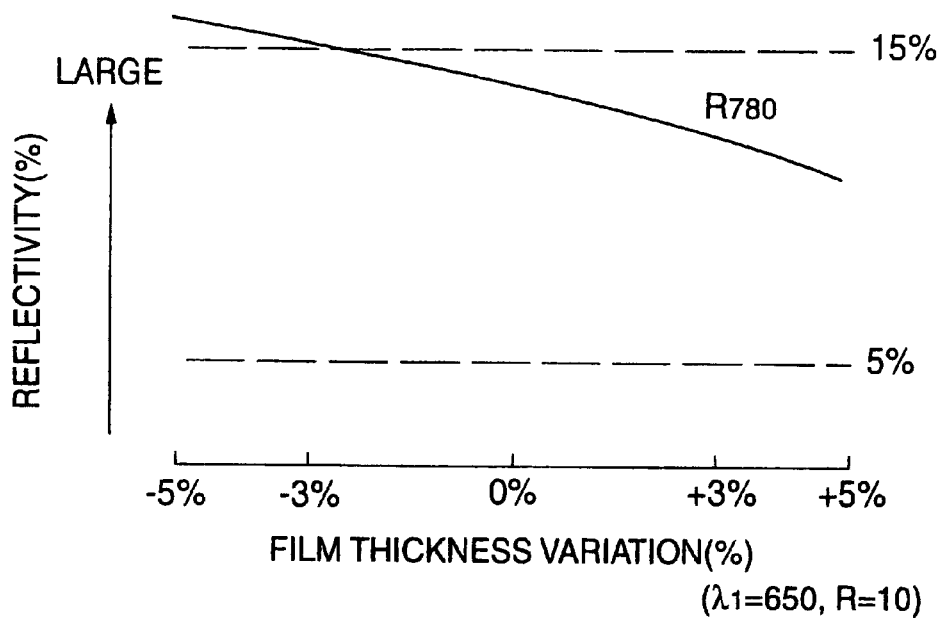
FIG. 19 is a graph showing changes in reflectivity of the front end face film at different wavelengths according to the second embodiment of the present invention.

FIGS. 18 and 19 show the reflectivity as a function of variations in the film thickness when the design wavelength λ1=650 nm is used. When the film thickness variation is ±5%, the reflectivity of the semiconductor laser diode having an oscillation wavelength of 650 nm exceeds the practical range of $3\% \leq R_{650} \leq 10\%$ at the reflectivity R=6%, if the film thickness varies to negative values (FIG. 18). Also, the reflectivity of the semiconductor laser diode having an oscillation wavelength of 780 nm exceeds the practical range of $5\% \leq R_{780} \leq 15\%$ at the reflectivity R=10%, if the film thickness varies to negative values (FIG. 19).

Figure 20:
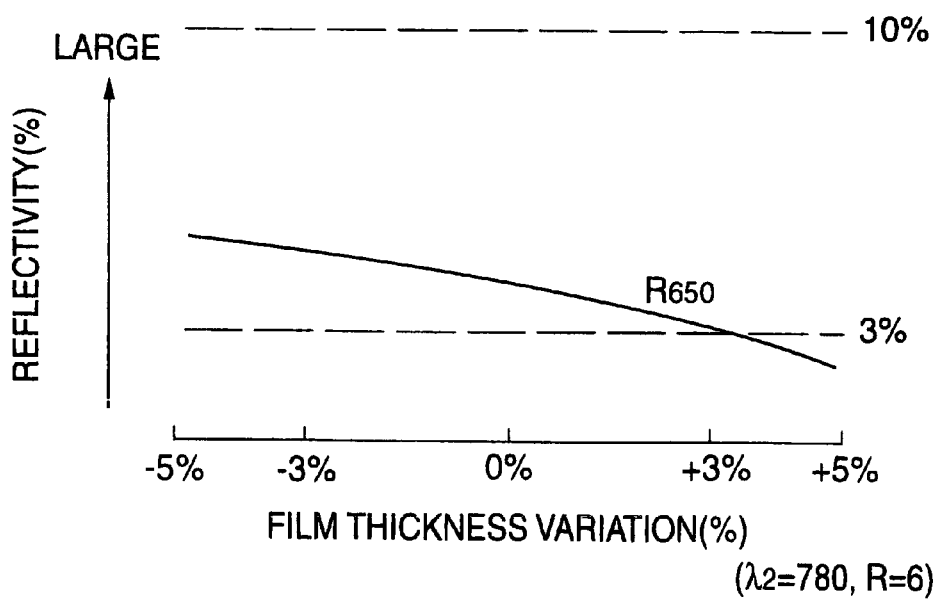
FIG. 20 is a graph showing changes in reflectivity of the front end face film at different wavelengths according to the second embodiment of the present invention.
Figure 21:
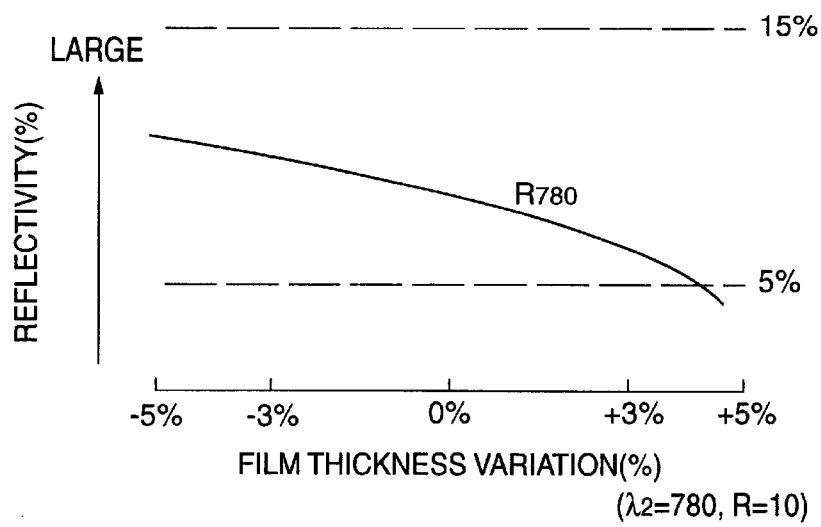
FIG. 21 is a graph showing changes in reflectivity of the front end face film at different wavelengths according to the second embodiment of the present invention.

FIGS. 20 and 21 show the reflectivity as a function of variations in the film thickness when the oscillation wavelength λ2=780 nm is used. When the film thickness variation is ±5%, the reflectivity of the semiconductor laser having an oscillation wavelength of 650 nm exceeds the practical range of $3\% \leq R_{650} \leq 10\%$ at the reflectivity R=6%, if the film thickness varies to positive values (FIG. 20). Also, the reflectivity of the semiconductor laser having an oscillation wavelength of 780 nm exceeds the practical range of $5\% \leq R_{780} \leq 15\%$ at the reflectivity R=10%, if the film thickness varies to positive values (FIG. 21).

From the foregoing, when the front end face film 40 has the film thickness calculated by using the mean wavelength, a desired reflectivity is obtained even if the film thickness more or less varies. However, if the film thickness is not calculated by using the mean wavelength, the reflectivity exceeds the practical range as the film thickness varies.

Figure 22:
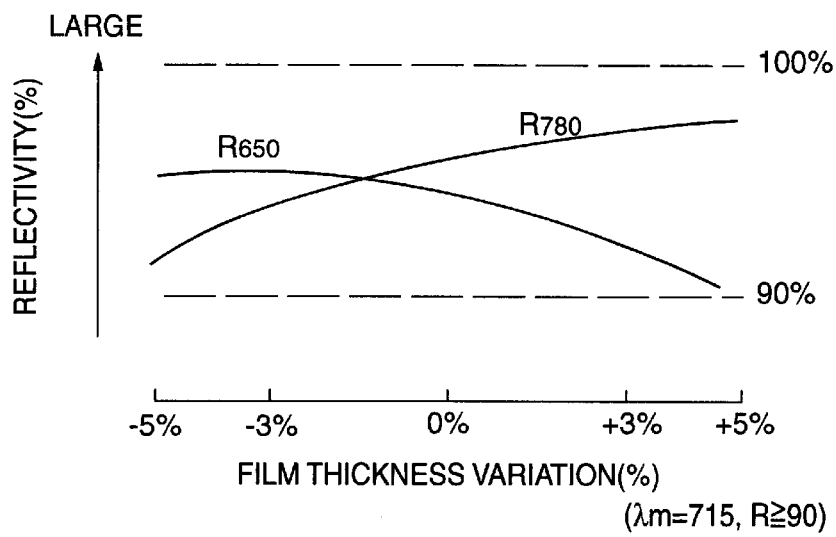
FIG. 22 is a graph showing changes in reflectivity of the high-reflectivity end face film at different wavelengths according to the second embodiment of the present invention.
Figure 23:
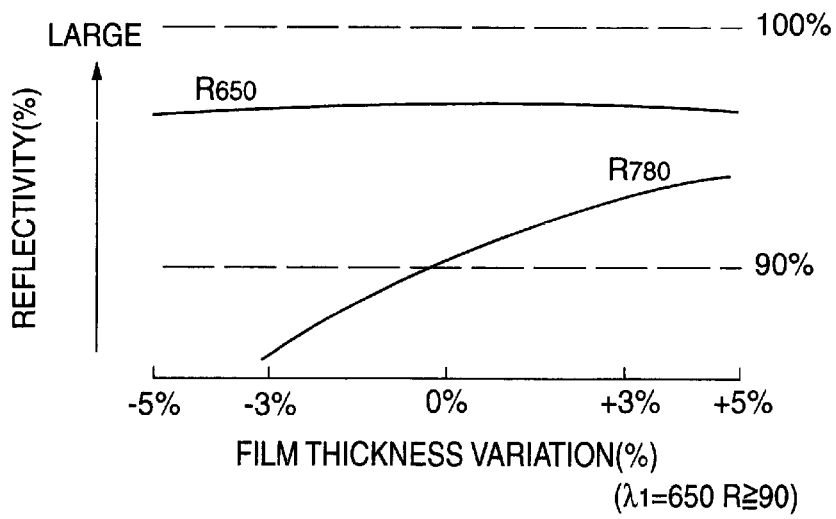
FIG. 23 is a graph showing changes in reflectivity for different wavelengths of the high-reflectivity end face film according to the second embodiment of the present invention.
Figure 24:
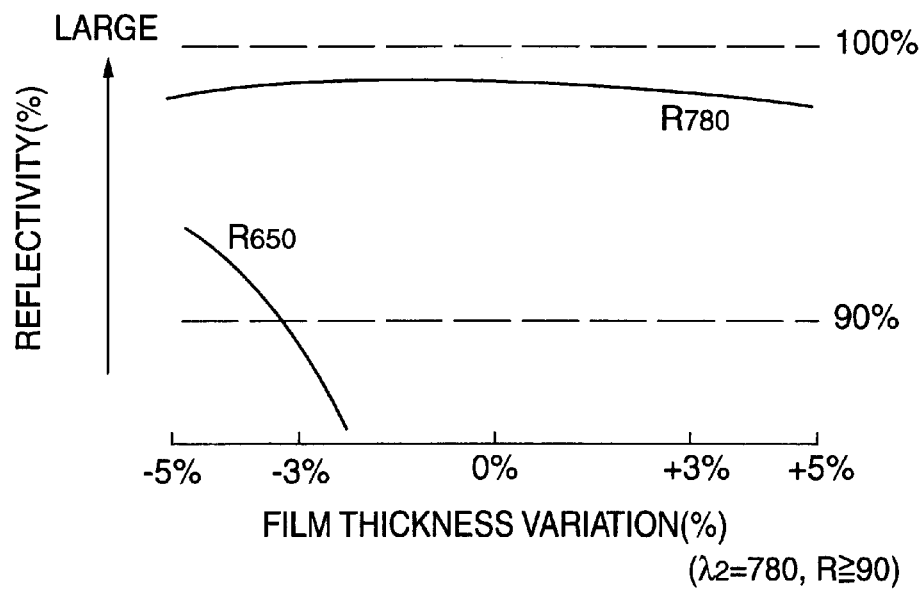
FIG. 24 is a graph showing changes in reflectivity for different wavelengths of the high-reflectivity end face film according to the second embodiment of the present invention.

The high-reflectivity end face film 30 will be similarly verified below. This high-reflectivity end face film 30 is a multilayered film having nine layers. Therefore, the possibility that reflectivity differences produced by film thickness errors of the individual thin films add up to make the overall reflectivity difficult to control cannot be ignored. FIGS. 22 to 24 show reflectivities as functions of variations in the film thickness of the high-reflectivity end face film 30.

FIG. 22 shows changes in reflectivities with variations in the film thickness when the design wavelength λm=715 nm is used to calculate a film thickness for obtaining the reflectivity R≧90%. When the desired film thickness is obtained, the reflectivity $R_{650}$ of the 650-nm semiconductor laser diode is 95%, and a reflectivity $R_{780}$ of the 780-nm semiconductor laser diode is 97%. Even when the film thickness has a variation of ±5% from the calculated value, the reflectivities of these two semiconductor lasers fall within the practical range of 90 to 100%. Therefore, reflectivities within the practical range are obtained even when the film thickness calculated on the basis of the design wavelength of 715 nm has a variation of ±5%.

FIG. 23 shows the reflectivity as a function of variations in the film thickness when the design wavelength λ1=650 nm is used to calculate the film thickness for obtaining the reflectivity R≧90%. When the film thickness variation is ±5%, the reflectivity of the semiconductor laser diode having an oscillation wavelength of 650 nm falls within the practical range of 90%≦$R_{650}$≦100%. However, if the film thickness varies from the desired value to negative values, the reflectivity of the semiconductor laser diode having an oscillation wavelength of 780 nm exceeds the practical range of 90%≦$R_{780}$≦100%.

FIG. 24 shows reflectivities as functions of variations in the film thickness when λ2=780 nm is used as a design wavelength. When the film thickness variation is ±5%, the reflectivity of the semiconductor laser diode having an oscillation wavelength of 780 nm falls within the practical range of 90%≦$R_{780}$≦100%. However, the reflectivity of the semiconductor laser diode having an oscillation wavelength of 650 nm falls outside the practical range of 90%≦$R_{650}$≦100%. Accordingly, no reflectivities within the practical range can be obtained by the film thickness calculated by using λ2=780 nm.

From the foregoing, when the high-reflectivity end face film 30 has the film thickness calculated using the mean wavelength, desired reflectivities can be obtained even if the film thickness more or less varies. However, if the film thickness is not calculated by using the mean wavelength, the reflectivity exceeds the practical range as the film thickness varies.

As described above, since each end face film has the film thickness calculated by using the mean value λm=(λ1+λ2)/2 of the oscillation wavelengths, i.e., λm=715 nm, the end face film can have reflectivity within the practical range even if the film thickness varies. In addition, the end face film can be formed at once by using EECR sputtering on the two semiconductor lasers having the oscillation wavelength λ1 and the oscillation wavelength λ2. Furthermore, it is readily possible to obtain a laser diode having a front end face reflectivity of 10% and a rear end face reflectivity of 90% or more.

The third embodiment will be described below.

Figure 25:
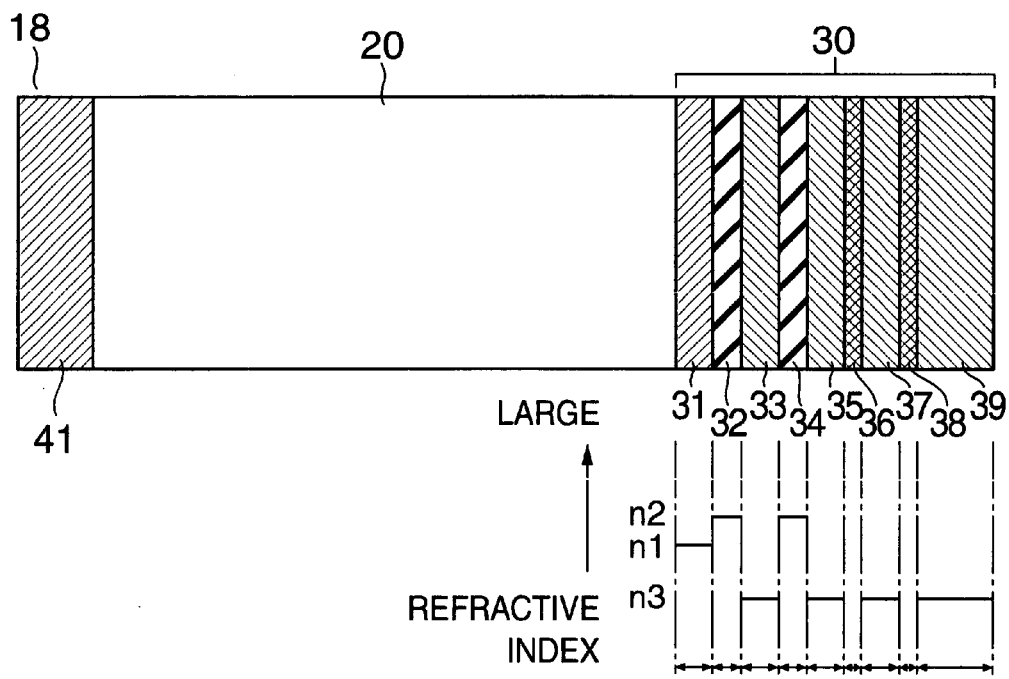
FIG. 25 is a view showing the end face film structure of a two-wavelength semiconductor laser according to the third embodiment of the present invention.

FIG. 25 shows the end face structure of a semiconductor laser according to the third embodiment. This third embodiment differs from the second embodiment in that a mean value λm=(λ1+λ2)/2 of the oscillation wavelengths of two semiconductor lasers having oscillation wavelengths of 650 and 780 nm, i.e., λm=715 nm, is used to obtain a film thickness by which a front end face film 41 having a reflectivity of 8%≦R≦20% or 29%≦R≦32% is formed. When the film thickness of the end face film satisfies the above reflectivity, a two-wavelength monolithic laser diode having various advantages can be provided. For example, when the front end face film 41 has a reflectivity of 8%≦R≦20%, reflected optical noise from an object to be irradiated with a laser can be reduced in a 650-nm band laser diode structure for a DVD-ROM. In a 780-nm band laser diode structure requiring high output so as to be used for a CD-R, interference by emitted light can be suppressed. When this front end face film 41 has a reflectivity of 29%≦R≦32%, the influence of reflected light from an optical disk ca be further reduced.

The stacked structures of the two semiconductor laser diodes having oscillation wavelengths of 650 and 780 nm are analogous to those of the second embodiment. That is, these two semiconductor laser diodes have an SBR structure, and an active layer has a multiple quantum well structure. In the 650-nm semiconductor laser diode, an InGaAl/InGaAlP material is used in the active layer. In the 780-nm semiconductor laser diode, an AlGaAs-based material is used in the active layer. A detailed description of the stacked structures of these two diodes will be omitted. The structure of a high-reflectivity end face film 30 of the semiconductor laser diodes is also a stacked structure identical with that of the second embodiment. This stacked structure includes nine layers of thin films made of low-refractive-index materials and thin films made of high-refractive-index materials. Si which absorbs light and has a high refractive index is used in a sixth layer 36 and an eighth layer 38.

As in the second embodiment, the front end face film 41 is made of a low-refractive-index material having a refractive index of 1.7 or less, and an example is $Al_2O_3$. The film thickness of this front end face film 41 is so set that the reflectivity is 8%≦R≦20% or 29%≦R≦32%. When this reflectivity is 8%≦R≦20%, the 650-nm oscillation laser diode has a reflectivity of 8%, and the 780-nm oscillation laser diode has a reflectivity of 20%. Since the front end face film of the two semiconductor lasers has a uniform film thickness, this front end face film can be formed at once by ECR sputtering. By this film formation method, it is possible to reduce damage to laser emission regions and provide a highly reliable device.

Figure 26:
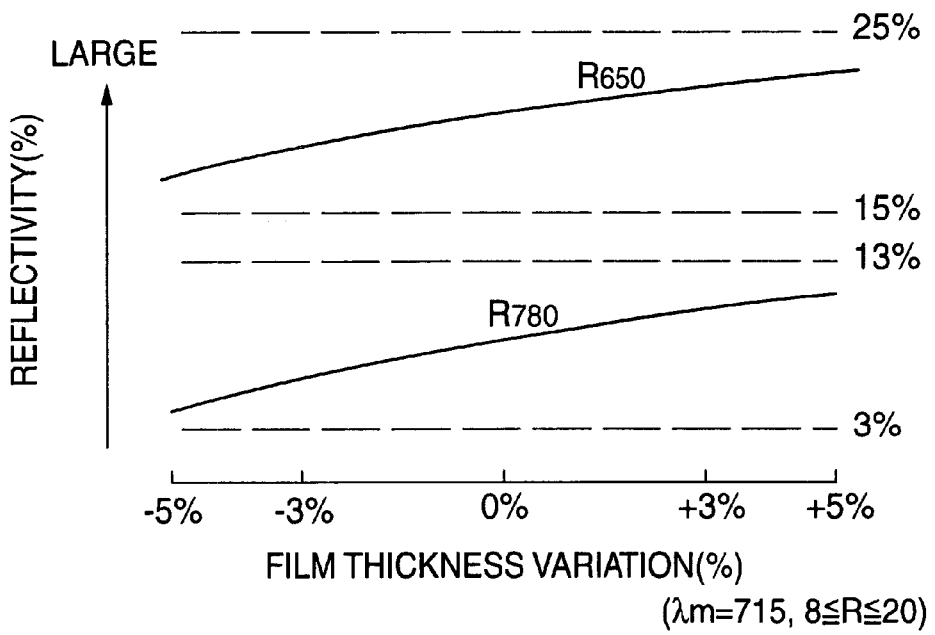
FIG. 26 is a graph showing changes in reflectivity of a front end face film at different wavelengths according to the third embodiment of the present invention.
Figure 27:
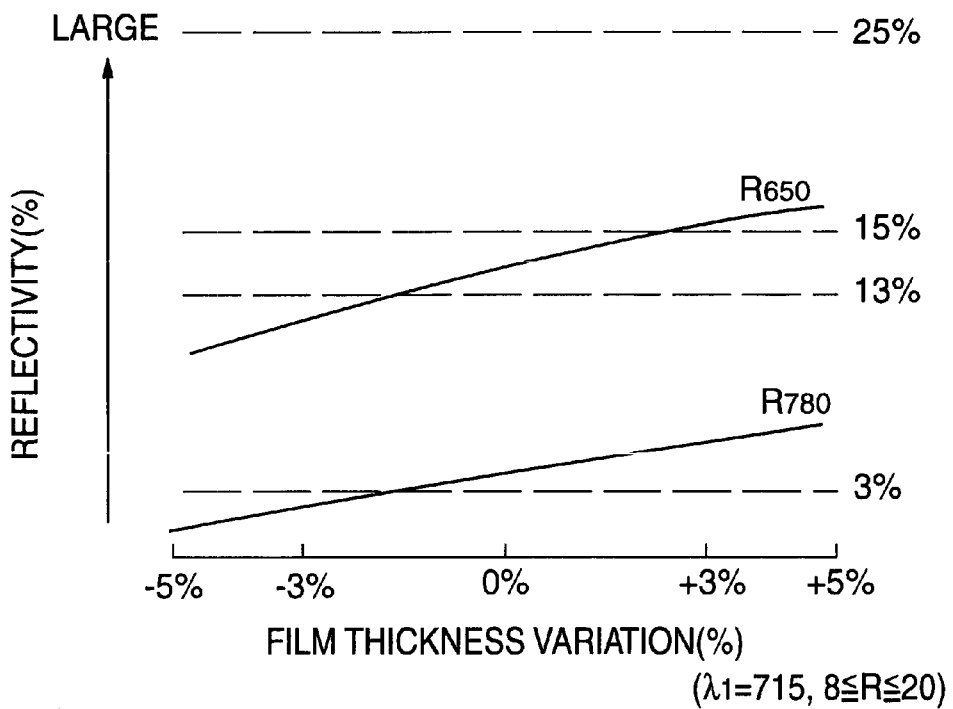
FIG. 27 is a graph showing changes in reflectivity of the front end face film at different wavelengths according to the third embodiment of the present invention.
Figure 28:
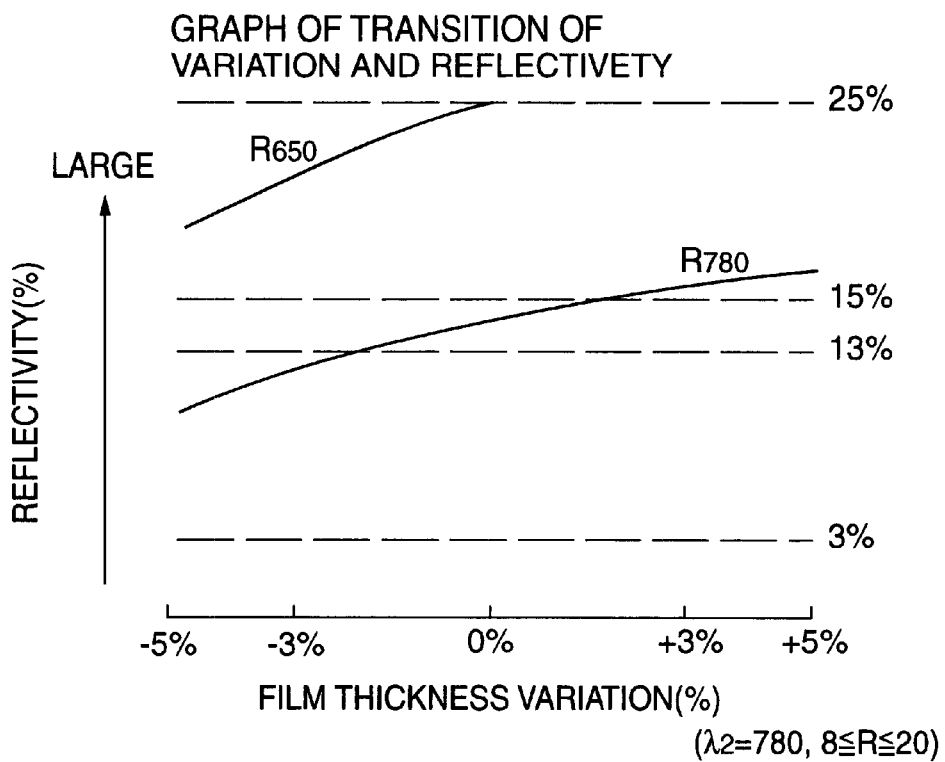
FIG. 28 is a graph showing changes in reflectivity of the front end face film at different wavelengths according to the second embodiment of the present invention.

FIGS. 26 to 28 show the reflectivity as a function of variations in the film thickness of the front end face film 41 having a reflectivity of 8%≦R≦20%.

FIG. 26 shows a case in which this front end face film 41 has a film thickness calculated by using the mean wavelength λm=715 as a design wavelength. When the desired film thickness is obtained, a reflectivity $R_{650}$ of the 650-nm semiconductor laser is 20%, and a reflectivity $R_{780}$ of the 780-nm semiconductor laser is 8%. When the film thickness has a variation of ±5% from the calculated value, the reflectivity of the 650-nm semiconductor laser falls within the practical range of 15%≦$R_{650}$≦25%, and the reflectivity of the 780-nm semiconductor laser falls within the practical range of 3%≦$R_{780}$≦13%. Therefore, appropriate reflectivities are obtained even when the film thickness calculated on the basis of the design central wavelength of 715 nm has a variation of ±5%.

FIG. 27 shows the reflectivity as a function of variations in the film thickness when the film thickness is so set that the reflectivity is 8%≦R≦20% at the design wavelength λ1=650 nm. When the film thickness variation is ±5%, the reflectivity of the semiconductor laser having an oscillation wavelength of 650 nm falls outside the practical range of 15%≦R$_{650}$≦25%. Also, the reflectivity of the semiconductor laser having an oscillation wavelength of 780 nm falls outside the practical range of 3%≦R$_{780}$≦13%.

FIG. 28 shows the reflectivity as a function of variations in the film thickness when the film thickness is so set that the reflectivity is 8%≦R≦20% at the design wavelength λ2=780 nm. When the film thickness variation is ±5%, the reflectivity of the semiconductor laser having an oscillation wavelength of 780 nm exceeds the practical range of 3%≦R$_{780}$≦13%. If the film thickness varies from the desired value to negative values, the reflectivity of the semiconductor laser having an oscillation wavelength of 650 nm exceeds the practical range of 15%≦R$_{650}$≦25%.

From the foregoing, when having the film thickness calculated by using the mean wavelength λm=715 nm, the two semiconductor lasers can obtain reflectivities of 8%≦R≦20%. Also, even if this film thickness more or less varies, the reflectivities fall within the practical ranges.

Figure 29:
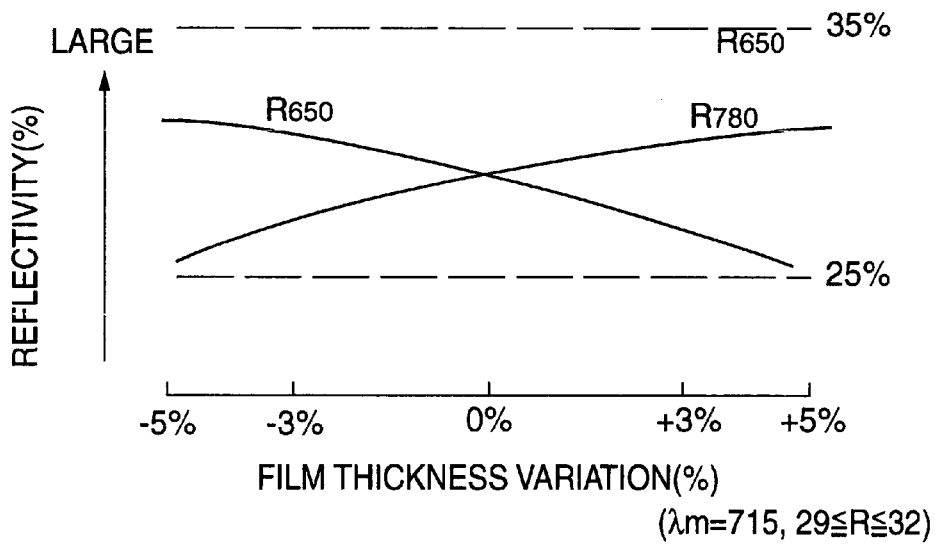
FIG. 29 is a graph showing changes in reflectivity of the front end face film at different wavelengths according to the second embodiment of the present invention.
Figure 30:
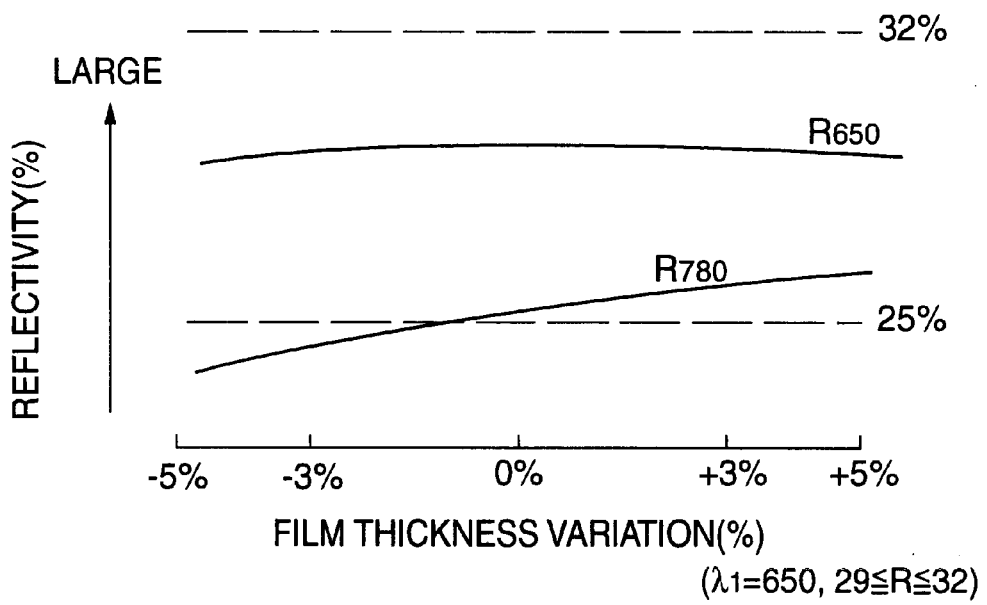
FIG. 30 is a graph showing changes in reflectivity of the front end face film at different wavelengths according to the second embodiment of the present invention.
Figure 31:
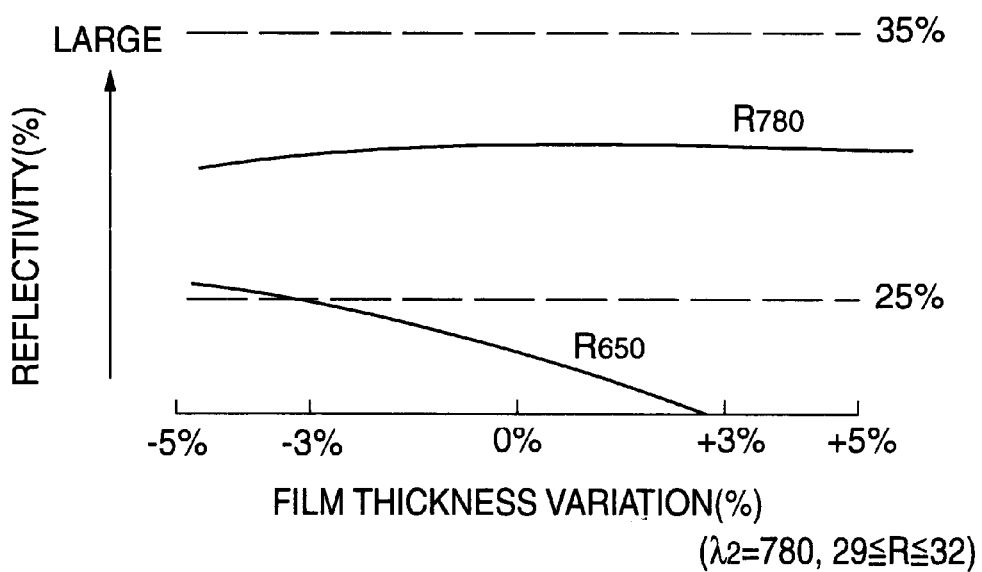
FIG. 31 is a graph showing changes in reflectivity of the front end face film at different wavelengths according to the second embodiment of the present invention.
Figure 32:
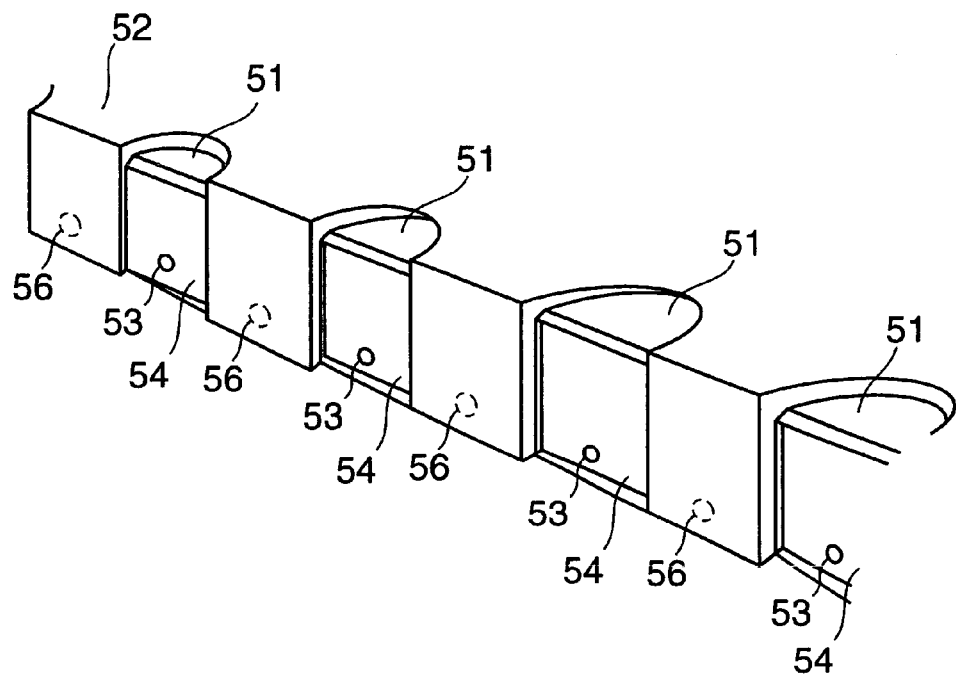
FIG. 32 is a view showing end face film formation steps relevant to the present invention.
Figure 33:
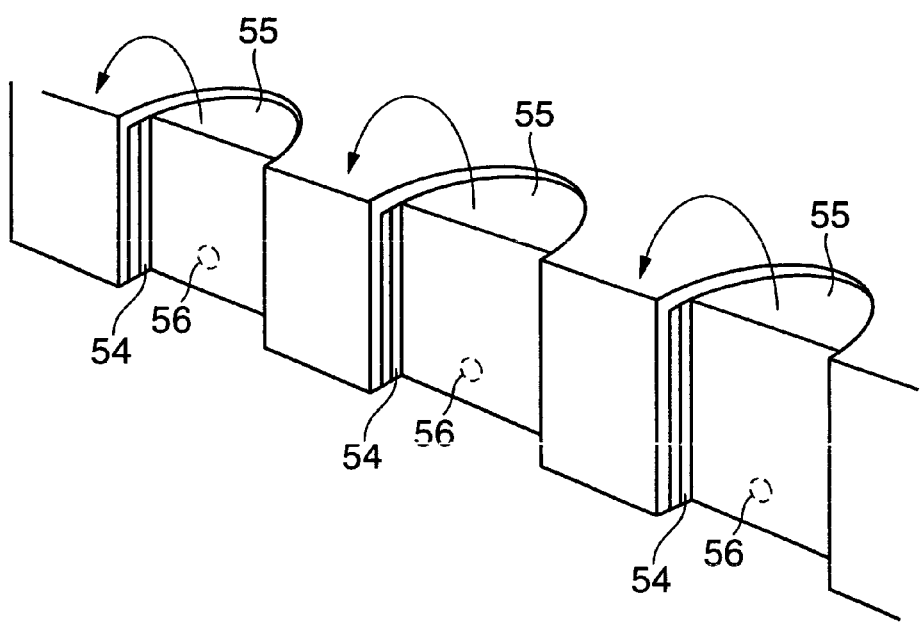
FIG. 33 is a view showing end face film formation steps relevant to the present invention.
Figure 34:
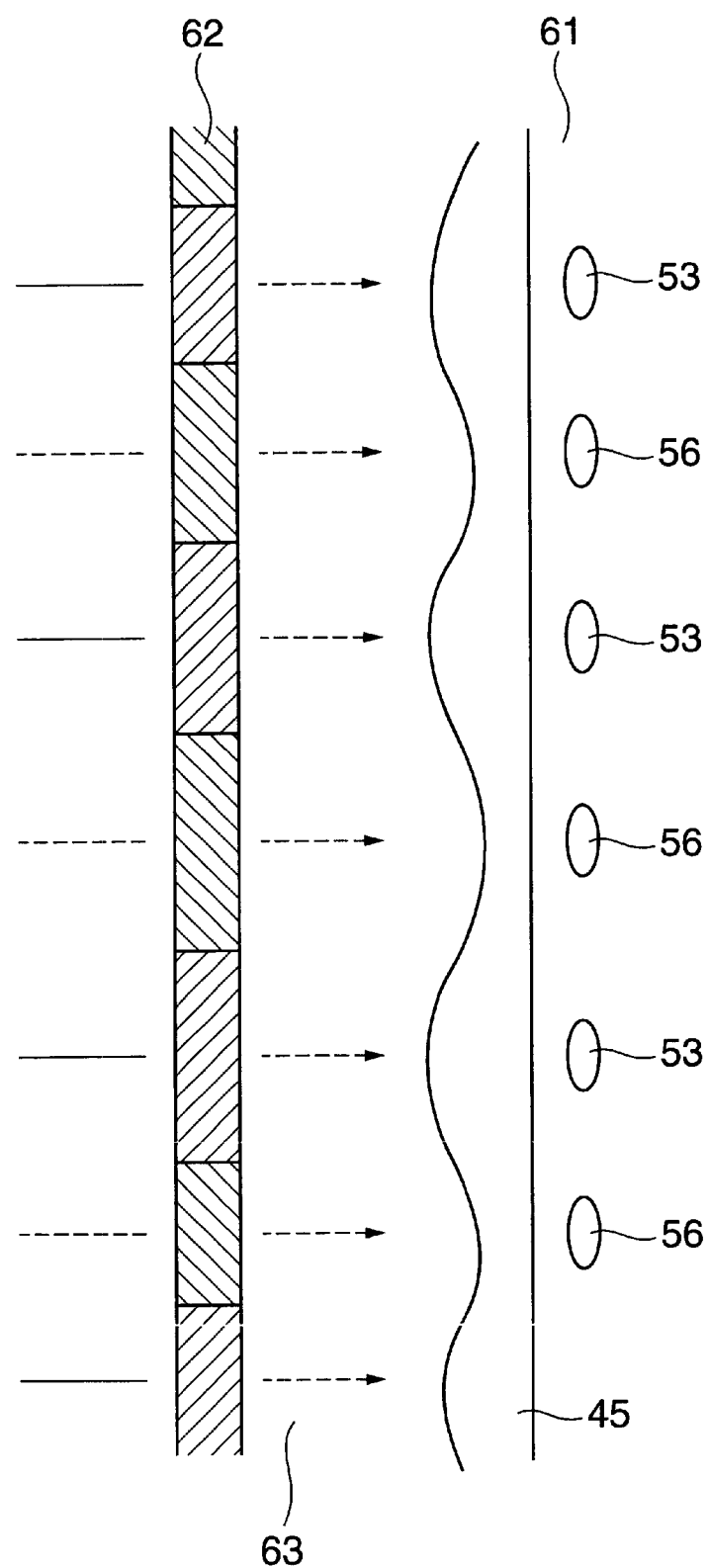
FIG. 34 is a view showing end face film formation steps relevant to the present invention.

FIGS. 29 to 31 show the reflectivity as a function of variations in the film thickness of the front end face film 41 having a reflectivity of 29%≦R≦32%.

FIG. 29 shows the reflectivity as a function of variations in the film thickness calculated by using the mean wavelength λm=715 nm as a design wavelength. When this film thickness has no variation, the reflectivity R$_{650}$ of the 650-nm semiconductor laser diode is 29%, and the reflectivity R$_{780}$ of the 780-nm semiconductor laser diode is 97%. When the film thickness has a variation of ±5% from the calculated value, the reflectivity of the 650-nm semiconductor laser diode falls within the practical range of 24%≦R$_{650}$≦37%, and the reflectivity of the 780-nm semiconductor laser diode falls within the practical range of 24%≦R$_{780}$≦37%. Therefore, appropriate reflectivities are obtained even when the film thickness calculated on the basis of the design central wavelength of 715 nm has a variation of ±5%.

FIG. 30 shows the reflectivity as a function of variations in the film thickness calculated by using the design wavelength λ1=650 nm. When the film thickness variation is ±5%, the reflectivity of the semiconductor laser having an oscillation wavelength of 650 nm falls within the practical range of 24%≦R$_{650}$≦37%. However, if the film thickness varies from the desired value to negative values, the reflectivity of the semiconductor laser having an oscillation wavelength of 780 nm falls outside the practical range of 24%≦R$_{780}$≦37%.

FIG. 31 shows the reflectivity as a function of variations in the film thickness calculated by using the design wavelength λ2=780 nm. When the film thickness variation is ±5%, the reflectivity of the semiconductor laser having an oscillation wavelength of 780 nm falls within the practical range of 24%≦R$_{780}$≦37%. However, if the film thickness varies from the desired value to positive values, the reflectivity of the semiconductor laser having an oscillation wavelength of 650 nm falls outside the practical range of 24%≦R$_{650}$≦37%.

From the foregoing, when having the film thickness calculated by using the mean wavelength λm=715 nm, the two semiconductor lasers can obtain reflectivities of 29%≦R≦32%. Also, even if this film thickness more or less varies, the reflectivities fall within the practical ranges.

As described above, each end face film has the film thickness calculated by using the mean value λm=(λ1+λ2)/2 of the oscillation wavelengths, i.e., λm=715 nm. Therefore, the end face film can be formed at once on the two-wavelength semiconductor laser including the two semiconductor lasers having the oscillation wavelength λ1 and the oscillation wavelength λ2. Also, it is readily possible to obtain a laser diode having high reflectivities, i.e., a front end face reflectivity of 8%≦R≦20% or 29%≦R≦32% and a rear end face reflectivity of 90% or more. Furthermore, even if the film thickness of each end face film varies ±5% from the calculated value, the two laser diodes can have reflectivities within the practical ranges.

In the semiconductor laser diodes according to the first to third embodiments, the stacked structures are not limited to those described above, and another structure can also be used. The materials of these stacked structures are also not limited to those of the above embodiments, so some other material can be used. The materials of the front end face film and the high-reflectivity end face film are also not limited to those of the above embodiments, and another material can be used. The numbers of stacked layers of the front end face film and the high-reflectivity end face film are also not limited to those of the above embodiments and can be properly changed.

As described above, in a monolithic two-wavelength semiconductor laser device, the film thickness of an end face film of the individual semiconductor laser diodes is calculated by using the mean value of the oscillation wavelengths of these semiconductor laser diodes. Therefore, an end face film having a uniform film thickness and a desired reflectivity can be obtained. Additionally, the fabrication steps can be simplified because the end face film can be formed at once. It is also possible to provide a two-wavelength semiconductor laser device having high reliability, meeting the required performance, and also having high productivity.

A semiconductor laser device of the present invention can provide an end face film having a desired reflectivity and capable of being formed at once. This makes it possible to provide a two-wavelength semiconductor laser device having high reliability, meeting the necessary performance, and also having high productivity.

What is claimed is:

1. A semiconductor laser device comprising:
   a substrate;
   a first laser element portion formed on said substrate to emit light having a first peak wavelength;
   a second laser element portion formed on said substrate to emit light having a second peak wavelength;
   front end face films formed on front end faces of said first and second laser element portions, having a uniform film thickness, and made of a same material;
   rear end face films formed on rear end faces of said first and second laser element portions, having a uniform thickness, and comprising a plurality of thin films made of the same materials respectively; and
   wherein the film thickness of said front end face films has an optical length d=(¼+i)×λ(I=0, 1, 2, . . . ) with respect to a mean wavelength λ of the first and second peak wavelengths, and the film thickness of said plurality of thin films of said rear end face films has an optical length d=(¼+j)×λ(j=0, 1, 2, . . . ) with respect to the mean wavelength λ of the first and second peak wavelengths.

2. The device according to claim 1, wherein said front end face film has a reflectivity of 3 to 37%, and said rear end face film has a reflectivity of not less than 75%.

3. The device according to claim 1, wherein said front end face film is made of a low-refractive-index material having a refractive index n<1.8, and said rear end face film comprises stacked layers of films made of a low-refractive-index material having a refractive index n<1.8 and thin films made of a high-refractive-index material having a refractive index n>1.9.

4. The device according to claim 1, wherein said front end face film is made of $Al_2O_3$, and said rear end face film comprises stacked layers of thin films made of a low-refractive-index material selected from the group consisting of $Al_2O_3$ and $SiO_2$ and thin films made of a high-refractive-index material selected from the group consisting of $SiN_4$ and Si.

5. The device according to claim 3, wherein said front end face film is made of $Al_2O_3$, and said rear end face film comprises stacked layer of thin films made of a low-refractive-index material selected from the group consisting of $Al_2O_3$ and $SiO_2$ and thin films made of a high-refractive index material selected from the group consisting of $SiN_4$ and Si.

6. A semiconductor laser device fabrication method comprising:
   forming, on a substrate, a first laser element portion which emits light having a first wavelength;
   forming, an said substrate, a second laser element portion which emits light having a second wavelength;
   forming front end face films having a uniform film thickness at once on front end faces of said first and second laser element portions by using electronic cyclotron resonance (ECR) sputtering; and
   forming rear end face films having a uniform film thickness and made of a same material and comprising a plurality of thin films made of the same materials respectively at once on roar end faces of said first and second laser element portions by using ECR sputtering, wherein the film thickness of said front end face films has an optical length $d=(\frac{1}{4}+i)\times\lambda$ ($i=0, 1, 2, \ldots$) with respect to a mean wavelength $\lambda$ of the first and second wavelengths, and the film thickness of said plurality of thin films of said rear end face films has an optical length $d=(\frac{1}{4}+j)\times\lambda$ ($j=0, 1, 2, \ldots$) with respect to the mean wavelength $\lambda$ of the first and second wavelengths.

7. The method according to claim 6, further comprising:
   forming said front end face film having a reflectivity of 3 to 37%; and
   forming said rear end face film having a reflectivity of not less than 75%.

8. The method according to claim 6, further comprising:
   forming said front end face film formed by using a law-refractive-index material having a refractive index n<0.8; and
   forming said rear end face film which comprises stacked layers of thin films made of a law-refractive-index mat al having a refractive index n<1.8 and thin films made of a high-refractive-index material having a refractive index n>1.9.

9. The method according to claim 6, further comprising:
   forming said front end ace film having an $Al_2O_3$, film; and
   forming said rear end face film having stacked layers of thin films made of a low-refractive-index material selected from the group consisting of $Al_2O_3$, and $SiO_2$ and thin films made of a high-refractive-index material selected from the group consisting of $SiN_4$, and Si.

10. The method according to claim 8, further comprising:
    forming said front end face film having an $Al_2O_3$; and
    forming said rear end face film having stacked layers of thin films made of a low-refractive-index material select from the group consisting of $Al_2O_3$ and $SiO_2$ and thin films made of a high-refractive index material selected from the group consisting of $SiN_4$, and Si.

11. The device according to claim 1, wherein said rear end face film comprises stacked 1a of thin films made of $Al_2O_3$, $SiN_2$, $SiO_2$, Si and $SiO_2$ in order, respectively.

12. The device according to claim 1, wherein said rear end face film comprises stacked layer of thin films made of $Al_2O_3$, $SiN_2$, $SiO_2$, $SiN_2$, $SiO_2$, Si, $SiO_2$, Si and $SiO_2$ in order, respectively.

* * * * *